(12) United States Patent
Park et al.

(10) Patent No.: US 6,568,280 B1
(45) Date of Patent: May 27, 2003

(54) METHOD OF COMPUTING BELT TENSION DISTRIBUTION OF METAL-PUSHING V-BELT FOR CVT

(75) Inventors: Jungho Park, Ann Arbor, MI (US); Trenton S. Meehan, Ann Arbor, MI (US); Ken Kanokogi, Wako (JP)

(73) Assignees: Mechanical Dynamics, Inc., Ann Arbor, MI (US); Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/705,702

(22) Filed: Nov. 6, 2000

(51) Int. Cl.$^7$ ................................................. G01N 3/08
(52) U.S. Cl. ....................................................... 73/828
(58) Field of Search ................... 73/828, 826, 862.472, 73/862.453; 474/109, 111, 245, 138, 201, 242, 272, 265; 198/810, 810.02, 810.04

(56) References Cited

U.S. PATENT DOCUMENTS

| | | | | |
|---|---|---|---|---|
| 4,841,783 A | * | 6/1989 | Marshek et al. | 73/862.48 |
| 5,798,456 A | * | 8/1998 | Tranquilla | 73/579 |
| 5,951,423 A | * | 9/1999 | Simpson | 474/109 |

OTHER PUBLICATIONS

Shimizu, H. et al. "Development of 3–D Simulation for Analyzing the Dynamic Behavior of a Metal Pushing V–Belt for CVTs", JSAE Paper 2001–01–0828, 1999; vol. 8–99, pp. 31–36.
Fujii, T. et al. "A Study of a Metal Pushing V–Belt Type CVT—Part 2: Compression Force Between Metal Blocks and Ring Tension", SAE Paper 930667, International Congress and Exposition, Detroit, Michigan, Mar. 1–5, 1993, pp. 13–22.
C.V.T Transmission Analysis: A Mechanical Discrete Analysis with Computer, 461–465.

A Discrete Analysis of Meatal–V Belt Drive, A. Karam and D. Play. pp. 391–327.
960720 A Numerical Approach to Analyze the Power Transmitting Mechanisms of a Metal Pushing V–Belt Type CVT, Yoshiki Fushimi and Toru Fuji, Doshisha Univ. Shigeru Kanehara, Honda Research and Development Co., Ltd, pp. 161–172.
The American Society of Mechanical Engineers, 1–9 pages.
3C1 Analysis of Belt Behavior and Slip Characteristics for a Metal V–Belt CVT, Nov. 23–26, 1991, pp. 394,395, 396, 397, 398 and 399.
Performance Analysis of a Variable Speed–Ration Metal V–Belt Drive, vol. 110, Dec. 1988, 10 pages.
940690 A New Approach for Analyzing Load Distribution of Toothed Belts at Steady States Using FEM, Ryuichi Kido and Takayuki Kusano, Bando Chemical Industries, Ltd., Toru Fujii, Doshisha Univ., pp. 23–32.
980824 Power Transmitting Mechanisms of CVT Using a Metal V–Belt and Load Distribution in the Steel Ring, Shinya Kuwabara and Toru Fujii, Doshisha Unversity, Shigeru Kanehara, Honda R&D Co., Ltd., pp. 49–59.

* cited by examiner

Primary Examiner—Hezron Williams
Assistant Examiner—C Dickens
(74) Attorney, Agent, or Firm—Arent Fox Kintner Plotkin & Kahn, PLLC

(57) ABSTRACT

A method of computing a belt tension distribution based on a multibody modeling method for the metal pushing V-Belt for CVTs. In order to reduce the complexity of the model, the ring is modeled as a virtual element that exists only as the second order differential equation. The virtual ring concept relies upon the instant locations and orientations of the blocks to compute total length, local bending, block-to-ring friction distribution, and friction-induced tension distribution of the ring. Simulation results show a good agreement with experimental results both in ring tension distribution and block compression distribution along the belt.

5 Claims, 31 Drawing Sheets

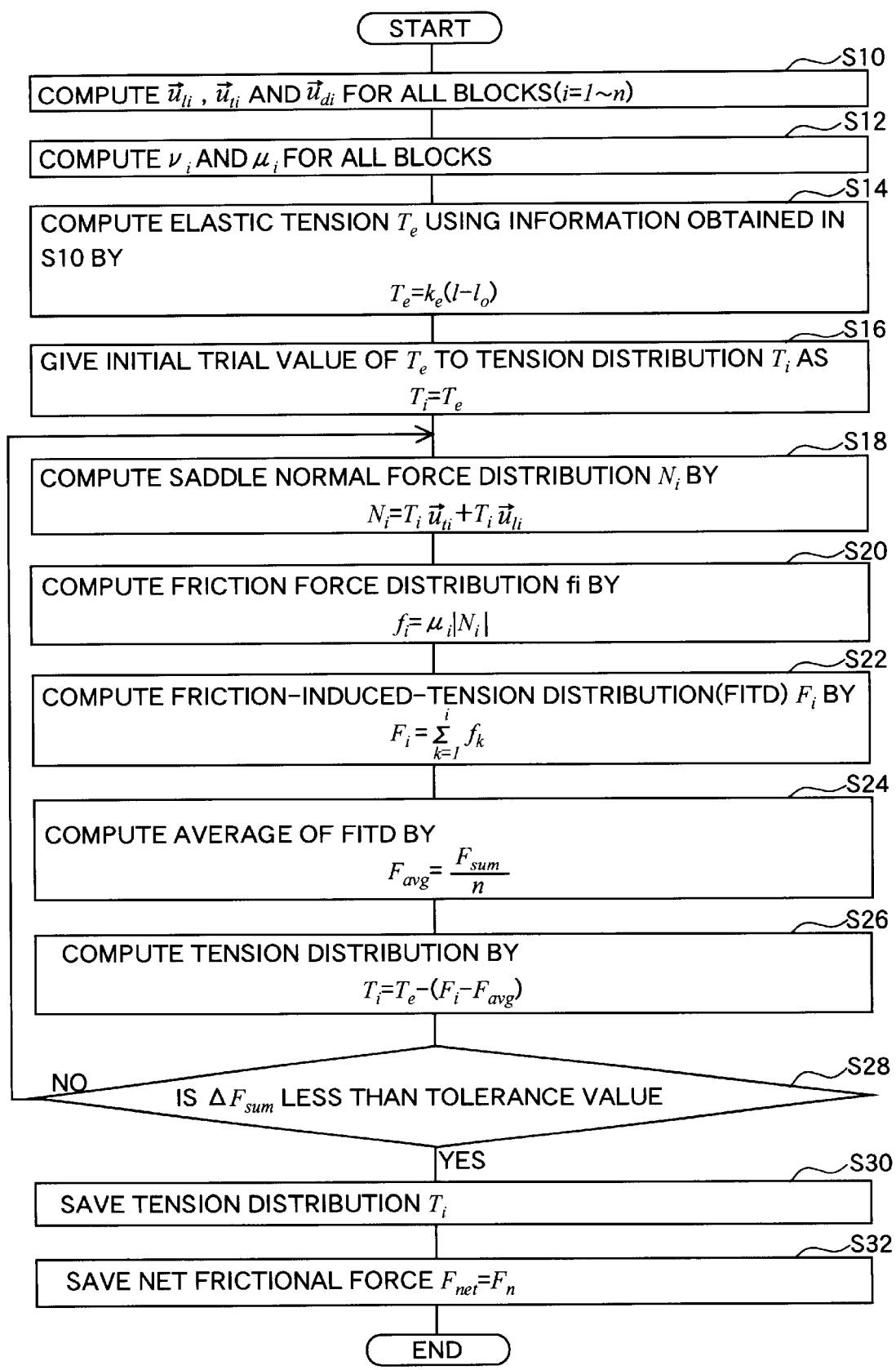

Block number distribution at time t

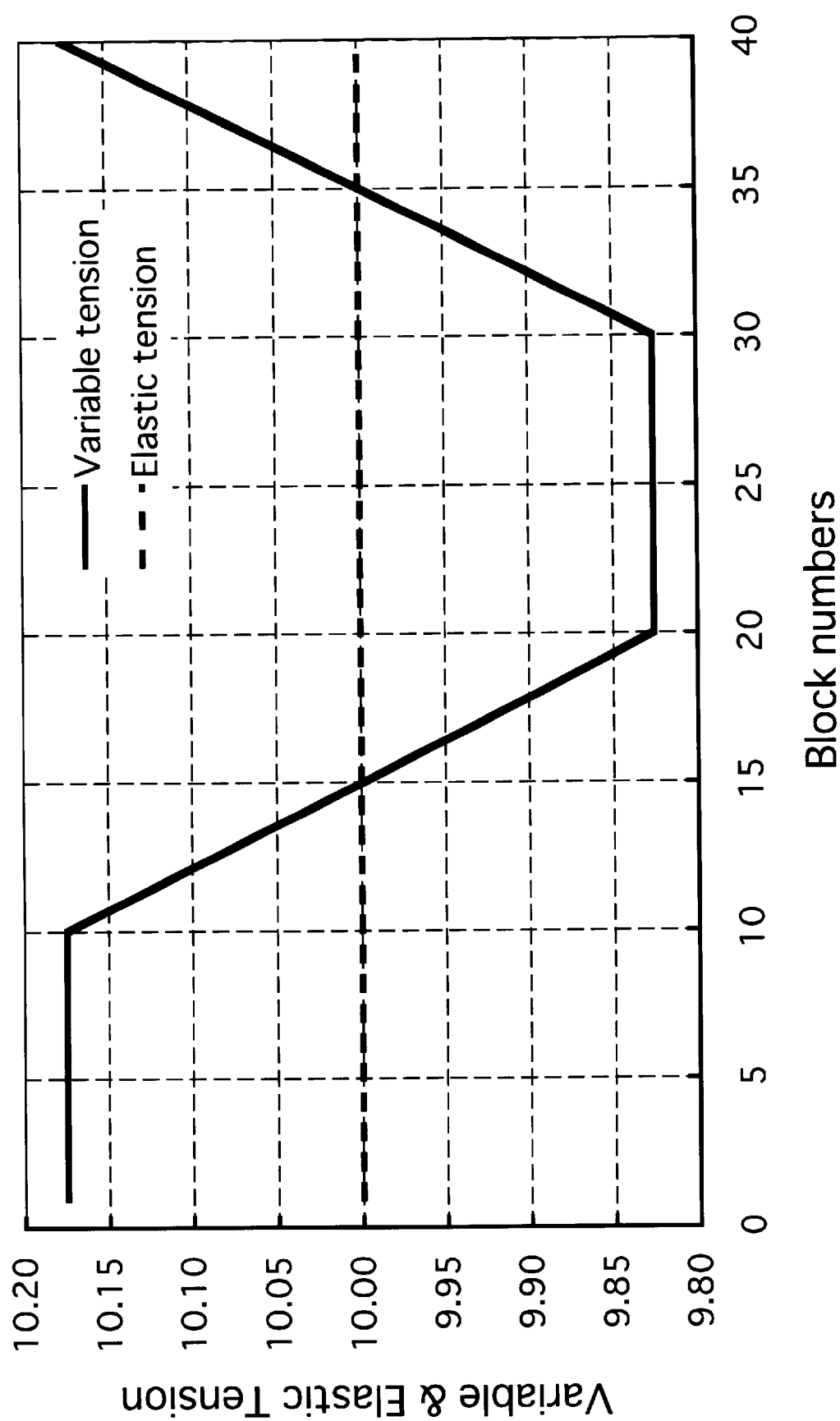

Block number distribution at time t+Δt

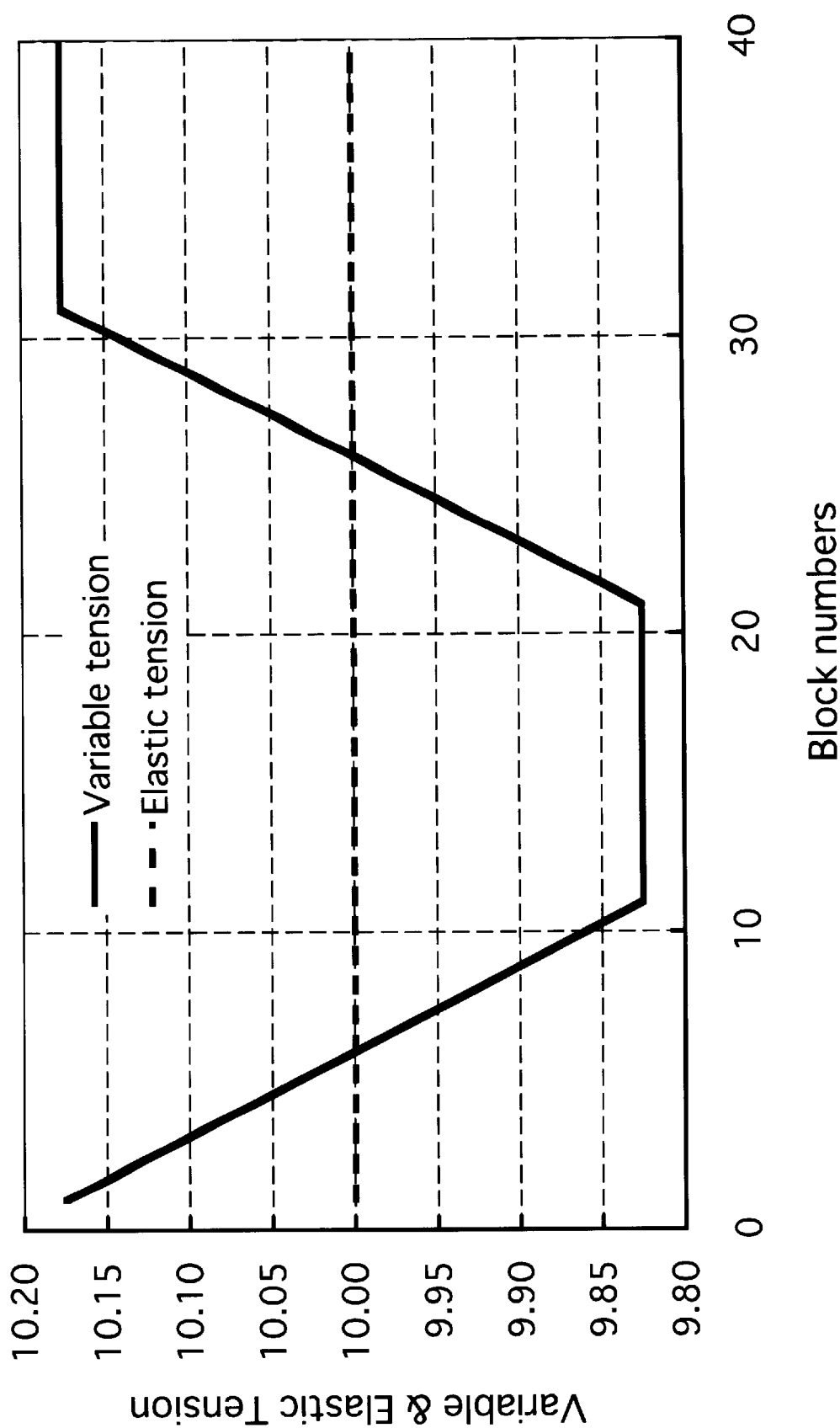

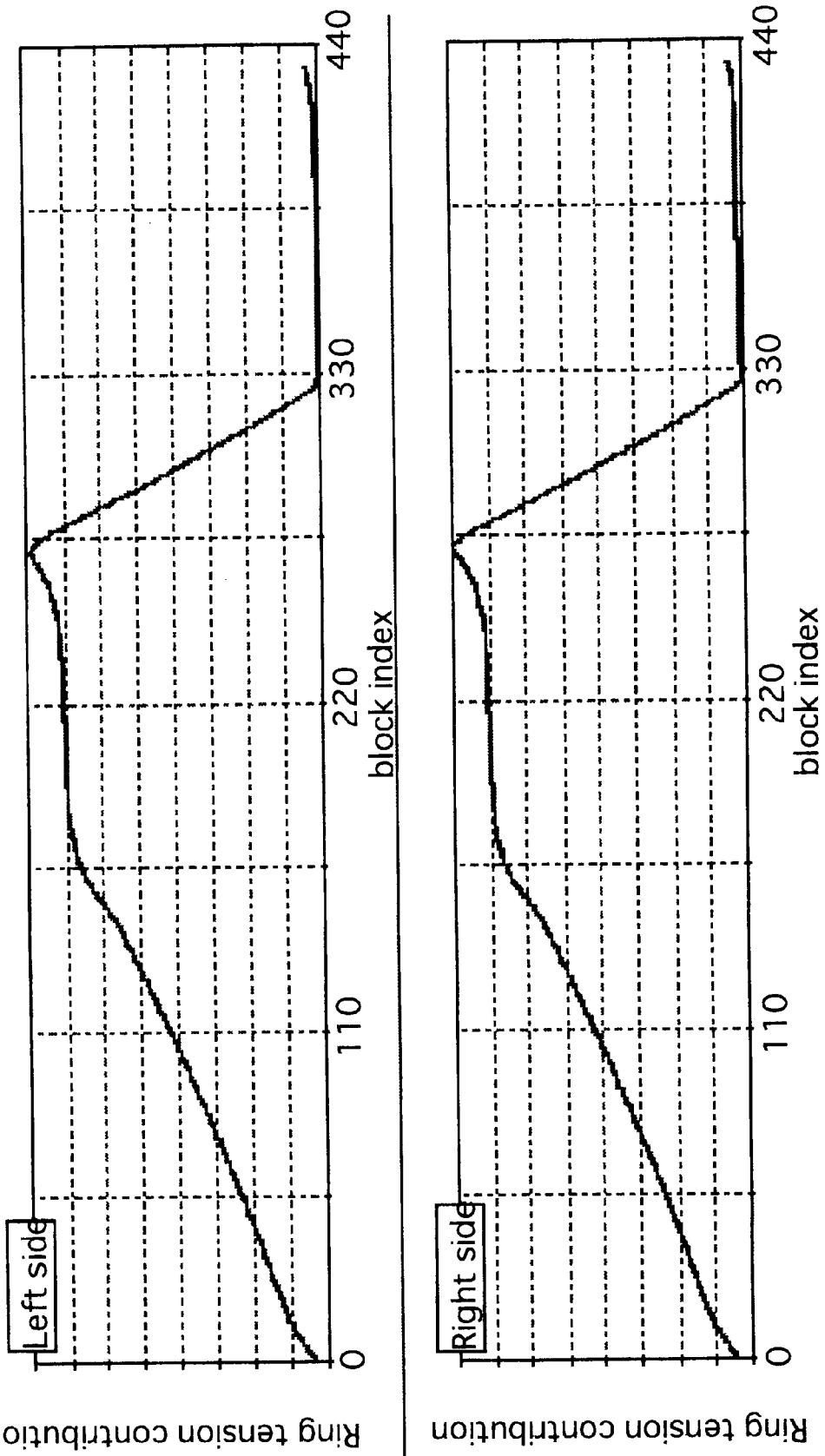

METHOD OF COMPUTING BELT TENSION DISTRIBUTION OF METAL-PUSHING V-BELT FOR CVT

BACKGROUND OF THE INVENTION

1. Field of the Invention

This invention relates to a method of computing belt tension distribution of a metal-pushing V-belt for CVTs (Continuously Variable Transmissions) to be mounted on a vehicle.

2. Description of the Related Art

The metal-pushing V-Belt is an essential part of CVTs. It transmits power from one pulley to another through the compressive contacts between its V-Block elements, while the two sets of flexible steel rings running through the V-blocks maintain belt tension. The friction and sliding between the B-blocks and the rings make it difficult to construct a computer model for the V-belt.

Many researchers introduced complex nonlinear equations to represent the power transmitting mechanisms of CVTs like G.Gerbert, "Metal V-Belt Mechanics", ASME paper, 84-DET-227, pp. 9, 1984; H.Kim et al, "Analysis of Belt Behavior and Slip Characteristics for a Metal V-Belt CVT", MPT91 Proc. Of JSME Int. Conf. On Motion and Power Transmission, Vol. 62, pp. 394–399, 1991; D. C. Sun, "Performance Analysis of Variable Speed-Ratio V-Belt Drive", J. Mech. Transmission. Autom. Design Transactions of the ASME, Vol. 110, pp. 472–481, 1988; J. M. Carvajal et al., "C.V.T Transmission Analysis; A Mechanical Discrete Analysis with Computer", I.N.S.A-Bar-113; and D.Play et al., "A Discrete Analysis of Metal V-Belt Drive", ASME Int. Power Transmission and Gearing Conf., DE-Vol. 43-1. They simplified the CVT system by assuming no radial motion of the V-blocks relative to the pulleys.

Y.Fushimi et al., "A Numerical Approach to Analyze the Power Transmission Mechanisms of a Metal Pushing V-Belt Type CVT", SAE Paper 960720, 1996, borrowed R. Kido's quasi-static approach (mentioned in "A New Approach for Analyzing Load Distribution of Toothed Belts at Steady Sates Using FEM", SAE Paper 940690, 1994) to obtain a steady-state solution of the CVT model. They modeled the metal—pushing V-belt using linear springs and interface (contact) elements. The linear springs are defined between the blocks, between the rings, between the blocks and pulleys. The interface elements are defined between the blocks and pulleys and between the blocks and rings. They modeled half of the CVT system, assuming that the system is axially symmetric.

S. Kuwabara et al., "Power Transmission Mechanisms of CVT Using a Metal V-Belt and Load Distribution in the Steel Ring", SAE Paper 980824, 1998 proposed a numerical model that allows minute rotations of both driving and driven pulleys so that the rings could influence the overall dynamics of the CVT system. H. Shimizu et al ("Development of 3-D Simulation for Analyzing the Dynamic Behavior of a Metal Pushing V-Belt for CVTs", JSAE Paper, Vol. 8–99, 1999) developed a 3-dimensional CVT model based on a commercial FEM simulation program. They modeled each block and band as separate finite-element bodies. Their simulation results showed good quantitative agreement with the experimental data. However, the computational cost was very high with about 50 hours by CRAY T90 super computer.

Furthermore, Kanehara et al. propose measuring compression force between the blocks and ring tension using a micro load cell installed on the blocks in "A Study of a Metal Pushing V-Belt Type CVT; Part 2: Compression Force Between Metal Blocks and Ring Tension", SAE Paper 930667, 1993. This needs to machine the blocks to install the small sensor thereat and is tedious. In addition, this configuration will make accurate measurement difficult at high speed, since the high speed rotation could damage the sensor and affect measuring devices connected to the sensor.

SUMMARY OF THE INVENTION

An object of this invention is to provide a method of computing belt tension distribution of a metal-pushing V-belt for CVTs, by modeling the metal-pushing type V-belt assembly. The blocks are modeled as rigid bodies with number of discrete contact points to represent any surface to surface contact between adjacent blocks and between a block and a pulley. It has been known that friction forces between the rings (laminated steel bands) and the blocks (V-shaped steel elements) induce a non-uniform ring tension distribution along the V-belt, which in turn affects the block-to-block compression force distribution along the belt. Complex nature of the ring in its elastic deformation and in the distributed contact and friction with many blocks makes it not practical to model the ring as a chain or rigid bodies or as a finite element-based elastic body. In order to circumvent this problem, the ring is modeled as a virtual element that exists only as the second order differential equation but still retains its elasticity, overall shape, and tension distribution. It is assumed that a ring is composed of one steel band and that the ring tension is applied to the left and right saddle surface centers of each block. The virtual ring concept relies upon the instant locations and orientations of the blocks to compute the total length, local bending, block-to-ring friction distribution, and tension distribution of the ring. The total ring length determines the pure elastic ring tension. The block-to-ring friction distribution along the ring provides the basis for computing the final tension distribution of the ring. Simulation results show a good agreement with experimental results both in ring tension distribution and block compression distribution along the belt.

In order to achieve the object, the present invention provides a method of computing belt tension distribution of a metal-pushing V-belt for CVTs having an array of V-shaped blocks and a plural sets of rings each running through slots formed at the blocks and wound around pulleys; comprising the steps of: modeling the blocks as rigid bodies with contact points to represent surface to surface contact between adjacent blocks and between the blocks and the pulleys, while modeling the rings as a closed-loop string which is subject to an elastic tension caused by the pulleys; dividing the closed-loop string into string segments, and computing the elastic tension and computing a friction force caused by at least one of the blocks for each of the string segments using the computed elastic tension as an initial value; computing a friction-induced-tension based on the computed friction force for each of the string segments; computing an average of the computed friction-induced tensions of the string segments; repeating the steps (b) to (d) until the average converges to the tolerance value; and computing a ring tension based on the average to determine the belt tension distribution based on the computed ring tension.

BRIEF DESCRIPTION OF THE DRAWINGS

The above and other objects and advantages of the invention will be more apparent from the following description and drawings, in which:

FIG. 3 is a flow chart showing the method of computing belt tension distribution of a metal-pushing V-belt for CVTs according to the embodiment of the invention;

FIGS. 12A–12F are a set of graphs, similar to FIG. 8, but showing the results when the method is applied to the system illustrated in FIG. 11;

FIGS. 14A–14F a set of graphs, similar to FIGS. 12, but showing the results when the method is applied to the system illustrated in FIG. 13;

FIG. 16 is a set of graphs showing a ring tension profile obtained by the sample simulation.

DETAILED DESCRIPTION OF THE PREFERRED EMBODIMENT

Figure 1:
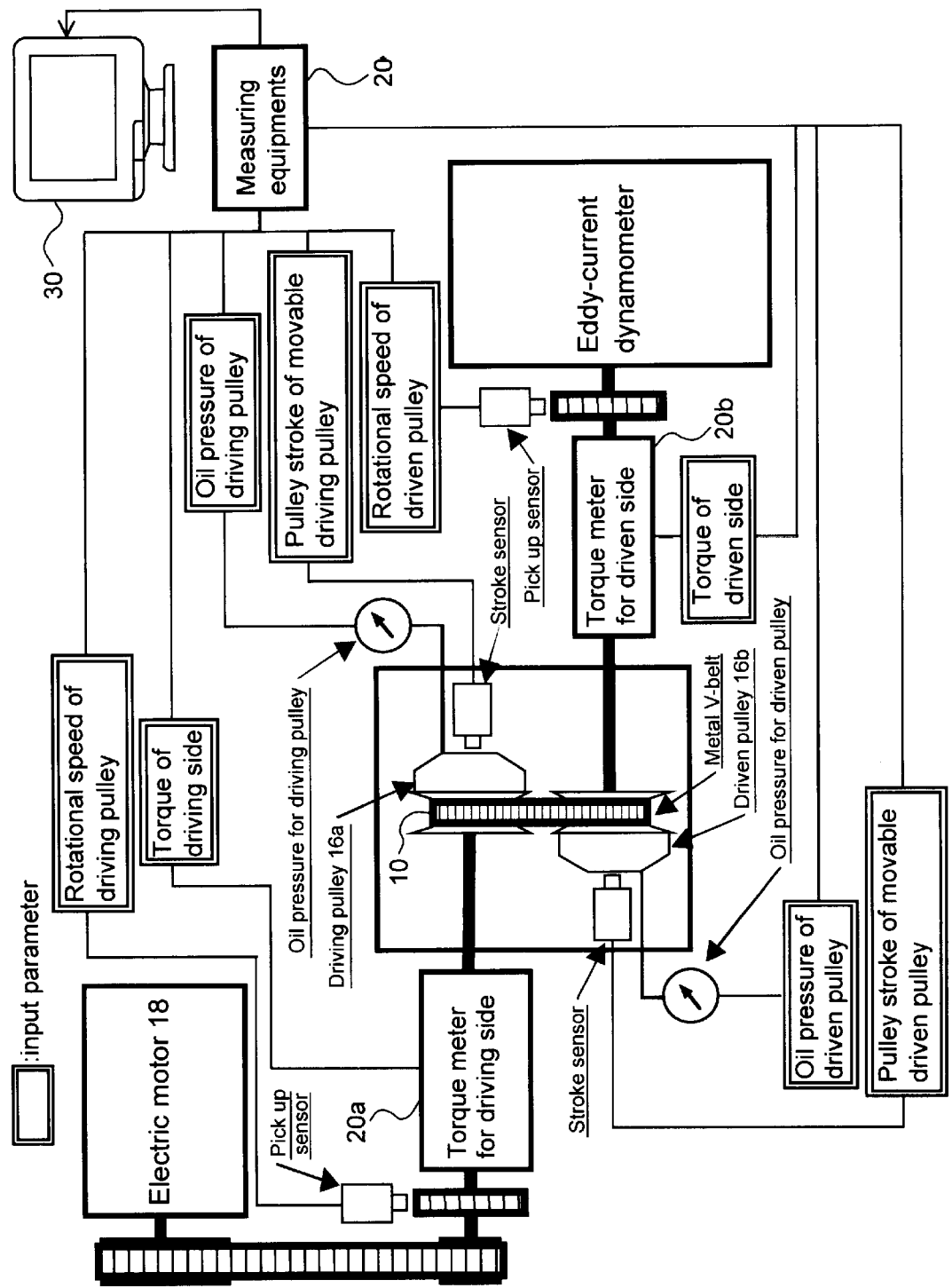
FIG. 1 is a schematic view showing a hardware configuration to be used in the method of computing belt tension distribution of a metal-pushing V-belt for CVTs according to an embodiment of the invention.

FIG. 1 is a schematic view showing a hardware configuration to be used in analyzing and modeling a metal-pushing V-belt for CVTs to compute belt tension distribution of the metal-pushing V-belt for CVTs according to an embodiment of the invention.

A metal-pushing V-belt assembly 10 for CVTs is composed of many V-blocks 12 and two sets of rings 14, as illustrated by thick lines and phantom lines in FIG. 2. As shown in FIG. 1, the metal-pushing V-belt is wrapped around pulleys, i.e. a driving pulley 16a and a driven pulley 16b whose bearings are mounted on a slide rail (not shown) installed on the laboratory floor. The driving pulley 16a is connected, instead of the internal combustion engine, an electric motor 18 through the gear mechanism to be rotated.

The driving and driven pulleys 16a, 16b are connected to a hydraulic mechanism and is varied their axial distance to change the speed ratio.

A group of sensors (generally expressed as "measuring equipments" 20) such as a torque meter for driving side 20a, a torque meter for driven side 20b, are installed at appropriate locations to detect the loads or forces acting on the driving and driven pulleys 16. The outputs of the measuring equipments 20 are sent to a microcomputer 30 having a CPU (operable at the clock frequency of 750 Mhz) and a RAM of 512 MB, etc. As will be explained below, the metal-pushing V-belt assembly 10 is modeled and based on the model, the ring tension distribution, block compression distribution, etc. are computed in the microcomputer 30 using the measured parameters.

In FIG. 1, the parameters in a double block indicate those input to the microcomputer 30. The testing equipment is indispensable for analyzing and modeling the metal-pushing V-belt assembly 10 as explained later. Once modelled, however, given parameters may instead be input to the microcomputer 30 to compute belt tension distribution of the same or similar kind of the V-belt.

Figure 2A:
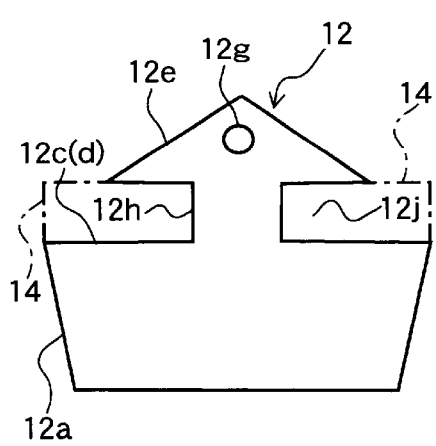
FIGS. 2A–2C are a set of schematic views each showing a block of the metal-pushing V-belt illustrated in FIG. 1.
Figures 2B, 2C:
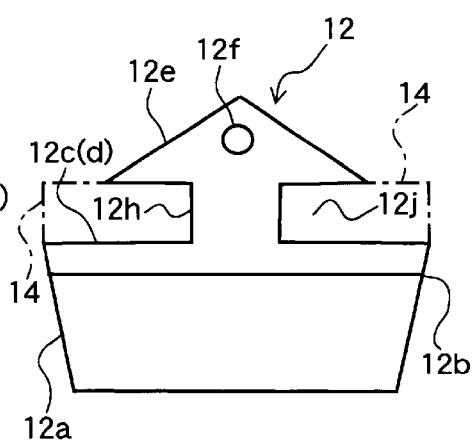

The components of the metal-pushing V-belt assembly are explained in detail again referring to FIG. 2. FIG. 2 is a set of schematic views of the block 12, in which FIG. 2A is rear view, FIG. 2B is a side view and FIG. 2C is a front view of the block 12.

The block 12 is a thin metal plate with trapezoidal shape. The block 12 has friction surfaces $12a$ on each side; wedged lower body forming a rocking edge $12b$ at its front face; saddle surfaces $12c$ on each side of its shoulders $12d$; triangular-shaped head $12e$; nose $12f$ at its front head face, dimple $12g$ at its rear head face; and the neck $12h$ connecting the head $12e$ and the body. The block 12 also has two slots $12j$ formed by the shoulder $12d$, neck $12h$ and head $12e$, through which the two rings 14 run. The rocking edge $12b$ allows two adjacent blocks to have some relative pitching angle when they are wrapped around the pulleys 16. The nose and dimple combination ensures array of blocks 12 properly aligned together. Each of the two set of rings 14 are laminated steel bands that are flexible enough to be wrapped around the pulleys 16 with arbitrary effective radius. The innermost steel band rides onto the saddle surfaces $12c$ of the blocks 12.

FIG. 3 is a flow chart showing the method of computing belt tension distribution of the metal-pushing V-belt for CVTs according to the embodiment of the invention.

Before entering the explanation, however, key geometric elements of the block 12 are described.

Figure 4:
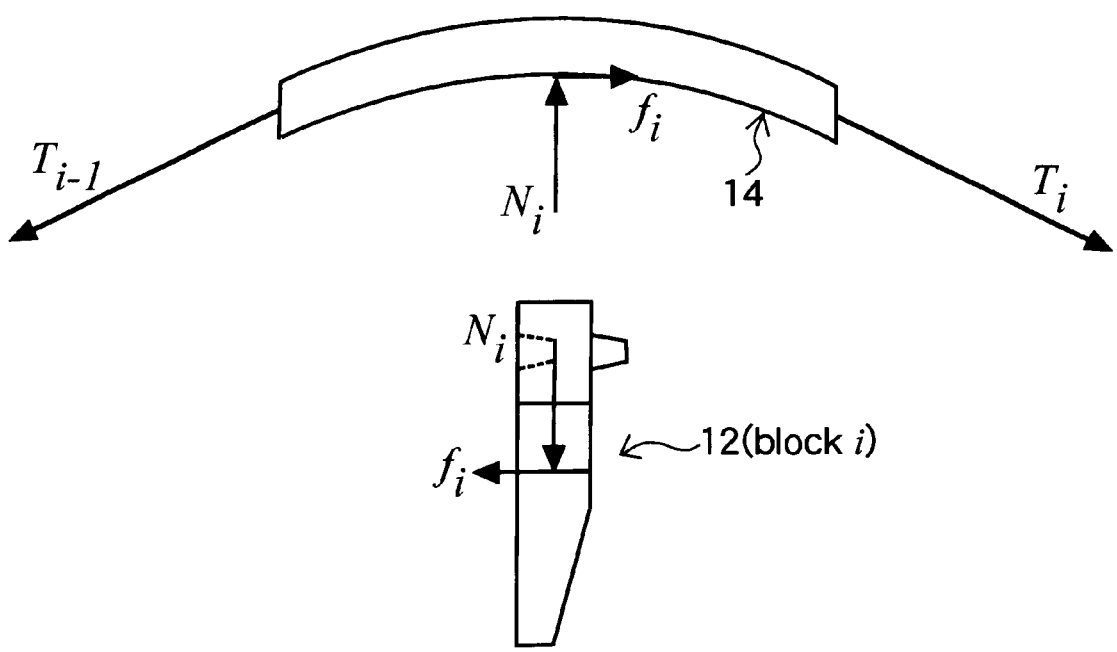
FIG. 4 is a schematic view showing a simplified force balance for the block and a ring of the metal-pushing V-belt illustrated in FIG. 2.

As the belt rotates around the driving (primary) and driven (secondary) pulleys 16, both the blocks 12 and the rings 14 receive various contact forces. The clamping of the two pulley halves exerts the block-to-pulley contact forces. The torque transmission from the driving pulley to the driven pulley causes the block-to-block compression (contact) forces. Any relative speed difference between the ring and the block will induce friction forces, and thus variation of the belt tension distribution. FIG. 4 shows a simplified force balance diagram for a block and a ring. The symbols in FIG. 4 are defined as below:

$T_i$: Ring tension between blocks i and i+1.

$T_{i-1}$: Ring tension between blocks i−1 and i.

$N_i$: Normal contact force between block i and ring.

$f_i$: Friction force between block i and ring.

It is evident from FIG. 4 that the difference of tangential components of $T_i$ and $T_{i-1}$ is $f_i$. In other words, it is the block-to-ring friction that induces the variation of ring tension along its length. Then, the question is what causes blocks and rings to have relative sliding speed.

Figure 5:
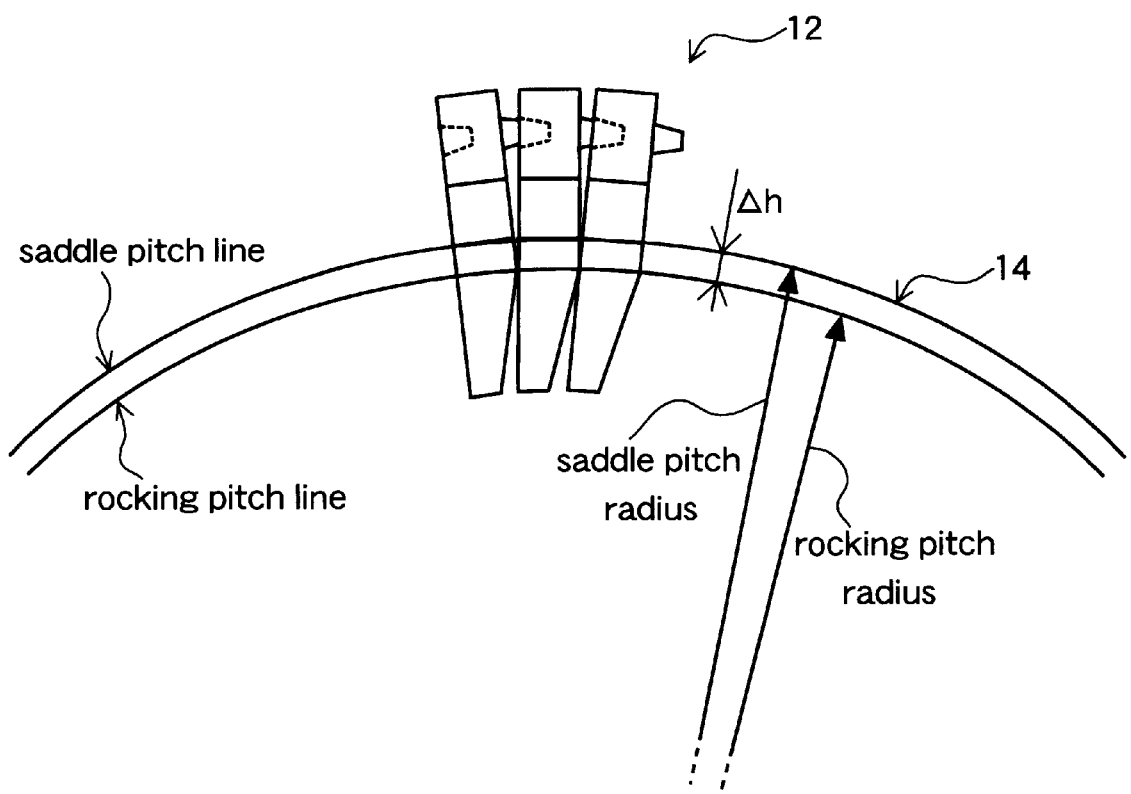
FIG. 5 is a schematic view showing a pitch radius difference at a wrap-around section between a saddle pitch line and a rocking pitch line of the block illustrated in FIG. 2.

The root cause for the relative speed difference between the ring and the block can be attributed to the height difference, $\Delta h$, between the saddle surface and the rocking edge. As the belt wraps around a pulley, the blocks pivot to each other around the rocking edge. This causes the effective radius difference between the saddle pitch line and the rocking pitch line as illustrated in FIG. 5. Let us define the radius ratio, $\alpha$, as the ratio of the saddle pitch radius, $r_s$, over the rocking edge radius, $r_r$:

$$\alpha = \frac{r_s}{r_r} \tag{1}$$

Here, the saddle surface radius can be expressed as a summation of rocking pitch radius and the height difference:

$$r_s = r_r + \Delta h \tag{2}$$

Substitution of Eq. (2) into Eq. (1) yields:

$$\alpha = \frac{r_r + \Delta h}{r_r} = 1 + \frac{\Delta h}{r_r} \tag{3}$$

Since the height difference is a fixed number of about 1 mm for a given block, Eq. (3) implies that the radius ratio is inversely proportional to the rocking edge radius. In other words, the smaller the effective radius, the larger the radius ratio. Therefore, the relative speed difference would be more significant on a pulley with a smaller effective radius.

The tension along an open-loop string will then be explained.

Figure 6:
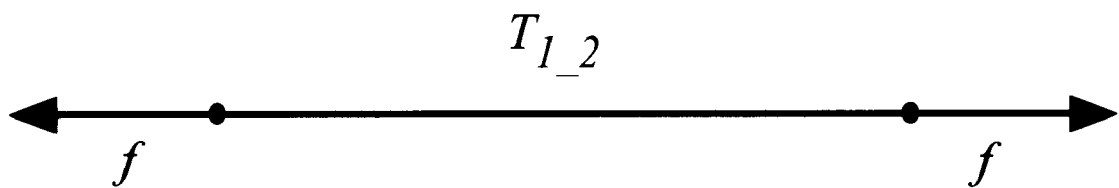
FIG. 6 is a schematic view showing a string of the ring with end nodes under constant tension force illustrated in FIG. 2.

Let us consider a string of a finite length with its end nodes 1 and 2 under constant force, f (see FIG. 6). The tension of the string between the two nodes, $T_{1\_2}$, is f.

Figure 7:
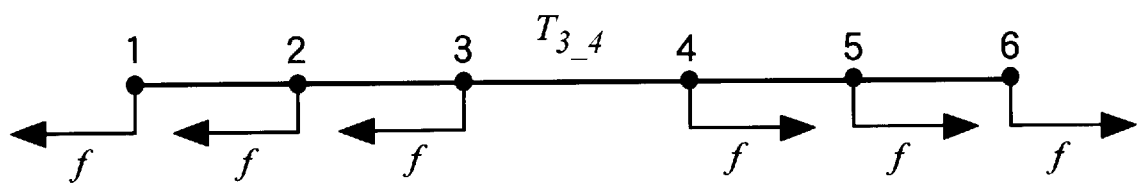
FIG. 7 is a schematic view showing a string of the ring under multiple nodal forces illustrated in FIG. 2.

Now, let us think of a string with multiple nodes and nodal forces (see FIG. 7). From the horizontal force equilibrium, tension at each string segment can be computed as:

$$T_{3\_4} = 3f$$

$$T_{2\_3} = T_{4\_5} = T_{3\_4} - f = 2f$$

$$T_{1\_2} = T_{5\_6} = T_{4\_5} - f = f \tag{4}$$

Here, $T_{i\_(i+1)}$ is defined as the tension of the string segment, $l_{i\_(i+1)}$, between the node i and i+1.

Based on Eq. (4), as we move along the string from the left end (node 1) to the center, the tension of the string segments $l_{1\_2}$, $l_{2\_3}$ and $l^3_{\_4}$ change as below:

$$T_{0\_1} = 0$$

$$T_{1\_2} = f$$

$$T_{2\_3} = T_{1\_2} + f = 2f$$

$$T_{3\_4} = T_{2\_3} + f = 3f \tag{5}$$

This implies that negative friction distribution increases the tension as we move along the string in positive direction (from left to right in this case). This observation can be expressed in mathematical form as:

$$T_{i\_(i+1)} = T_{0\_1} + \sum_{k=1}^{i} f_k^{neg} \tag{6}$$

Here, $T_{0\_1} = 0$ serves as a reference-tension, and $f_i^{neg}$ is the absolute magnitude of the negative nodal force at node i.

Likewise, as we move along the string from the center to the right end (node 6), the tensions of string segments, $l_{3\_4}$, $l_{4\_5}$ and $l_{5\_6}$ change as below:

$$T_{3\_4} = 3f$$

$$T_{4\_5} = T_{3\_4} - f = 2f$$

$$T_{5\_6} = T_{4\_5} - f = f \tag{7}$$

This implies that positive friction distribution decreases the tension as we move along the string in positive direction. This observation can be expressed in mathematical form as:

$$T_{i\_(i+1)} = T_{3\_4} + \sum_{k=4}^{i} f_k^{pos} \tag{8}$$

where i=4, 5, or 6. $f_i^{pos}$ is the absolute magnitude of the positive nodal force at node i.

The Eqs. (6) and (8) can be combined and generalized as below:

$$T_i = T_{ref} - \sum_{k=1}^{i} f_k \tag{9}$$

where $$T_i = T_{i\_(i+1)}$$

$$T_{ref} = T_{0\_1} = 0 \tag{10}$$

Note that $f_i$ can be either positive or negative depending on its direction and that $T_{ref}$ is the reference tension at the starting free end of the string, which is zero in the case of open string.

The tension along a closed-loop string will then be explained.

When there is no tangential friction force onto a closed-loop string that is wrapped around two pulleys, the tension distribution would be the constant-elastic tension, $T_e$. The elastic tension depends upon the elongation of the string. If there exists tangential friction forces acting onto the string, the tension distribution would be the summation of the elastic tension and the additional tension due to the friction forces:

$$T_i = T_e + T_{ref}^{i=1} - \sum_{k=1}^{i} f_k \tag{11}$$

Here, the last two terms corresponds to the additional tension due to the friction forces. The problem in the application of Eq. (11) is that the reference tension, $T_{ref}^{i=1}$, at the starting node 1 is unknown. If we initially assume that the reference tension is zero, then the computed tension distribution would depend upon the node we choose as the starting node. In other words, the computed tension distribution curve would shift up or down depending upon the selection or location of the starting node. Therefore, we need to find out the tension adjustment value that will cancel out the starting-node-dependency problem by properly shifting up or down the tension distribution curve.

Figure 8A:
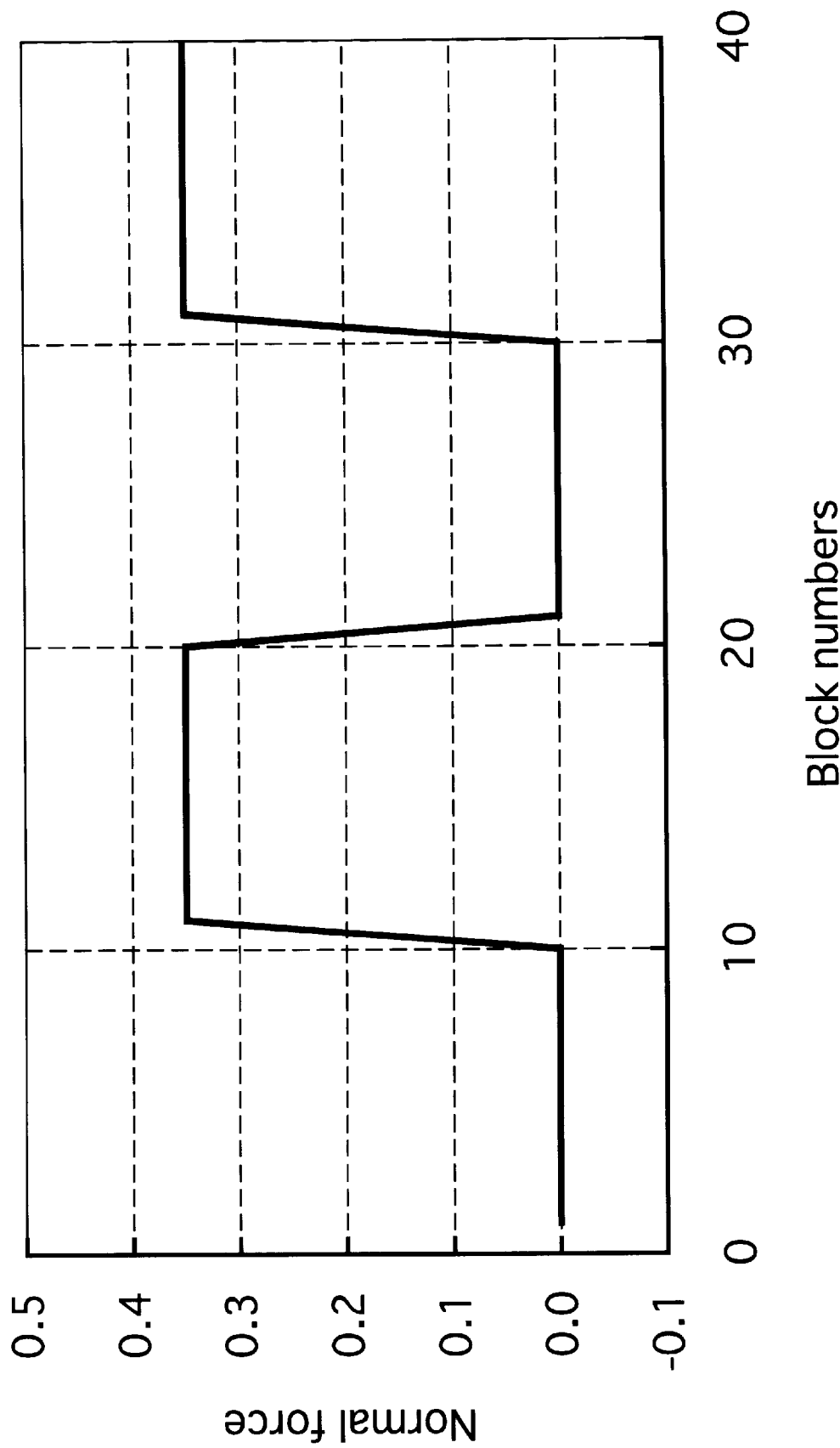
FIGS. 8A–8F are a set of graphs each showing normal force distribution, etc. obtained based on an assumption on which the method is made.
Figure 8B:
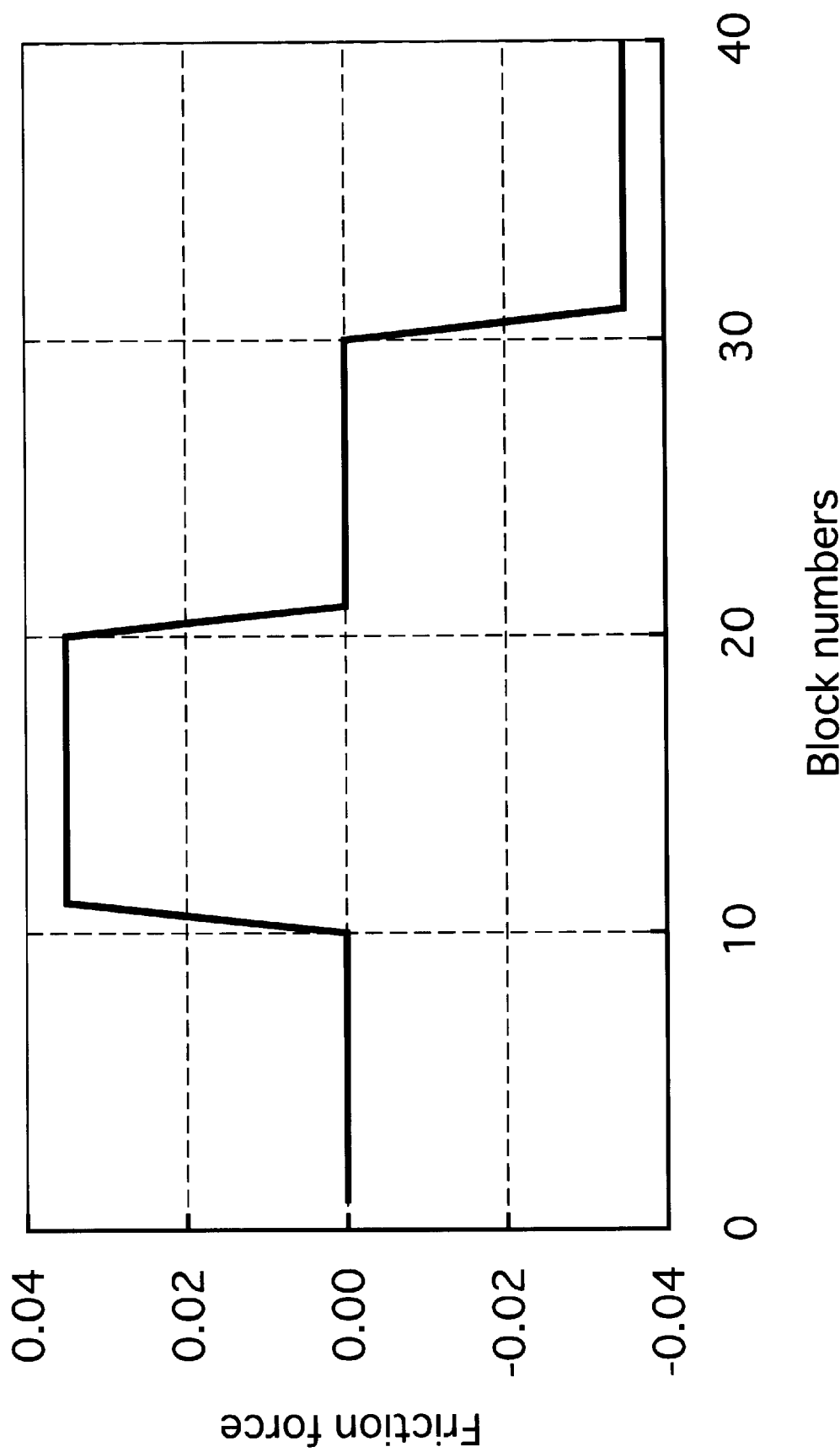
Figure 8C:
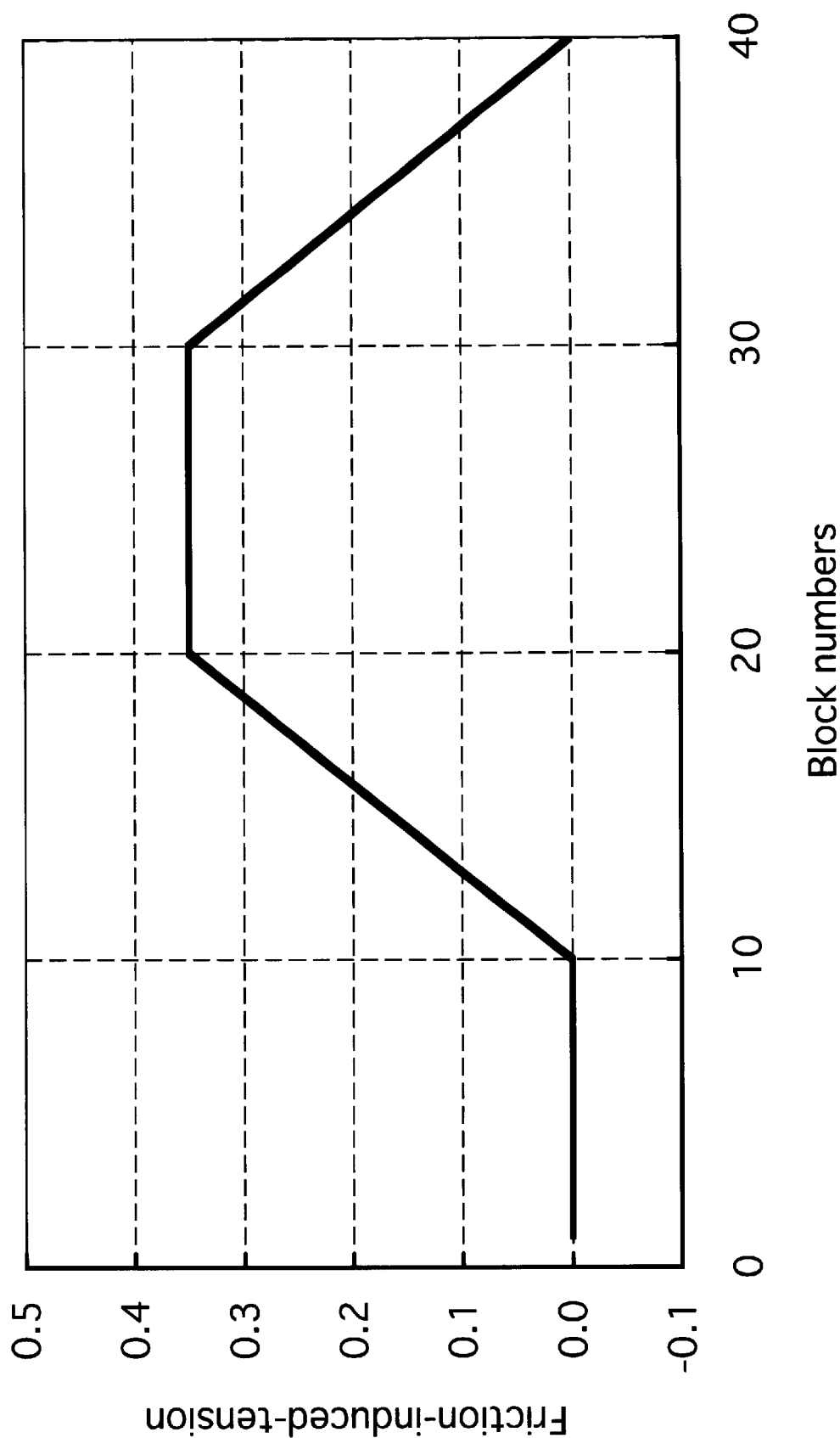
Figure 8D:
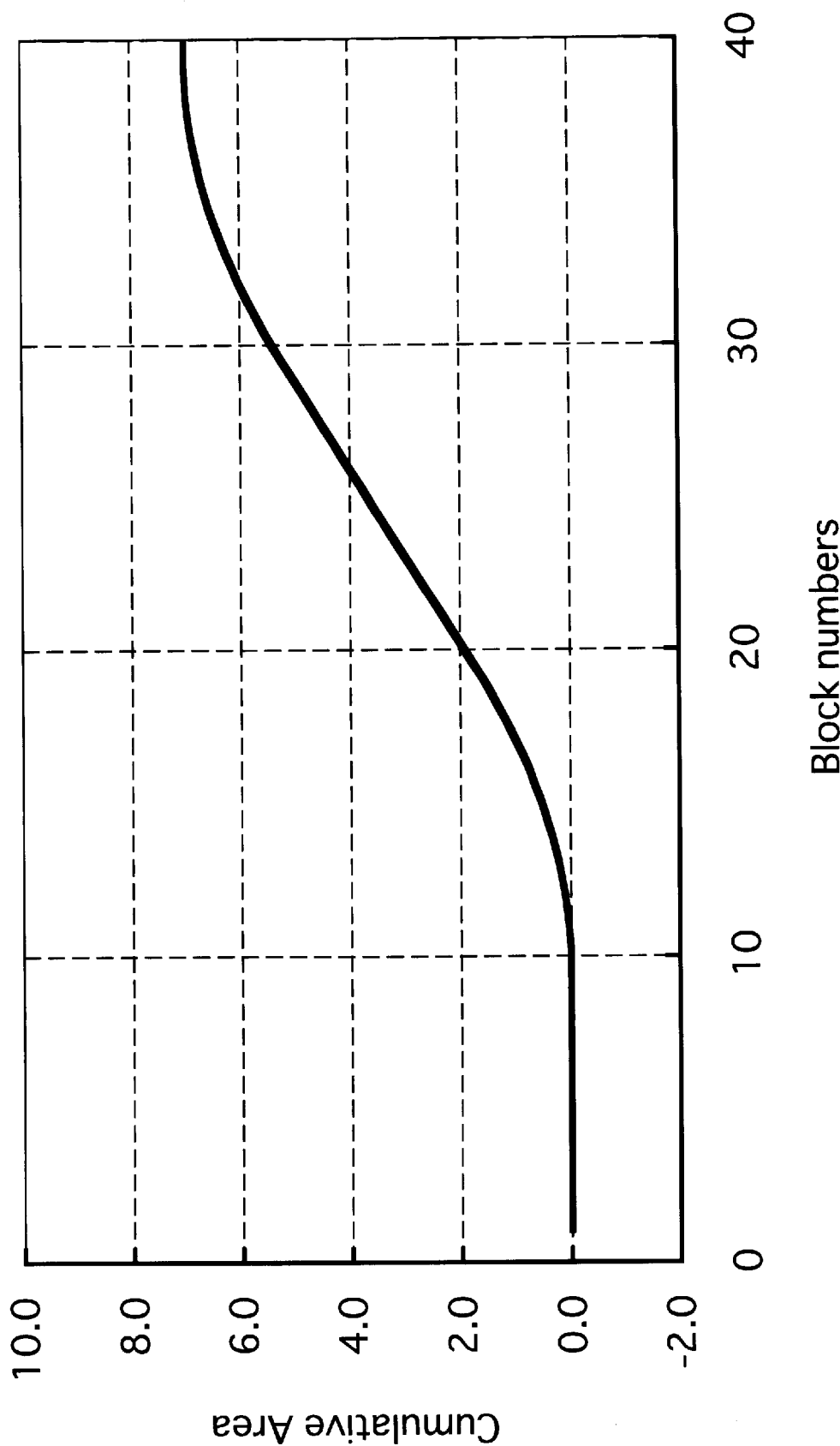
Figure 8E:
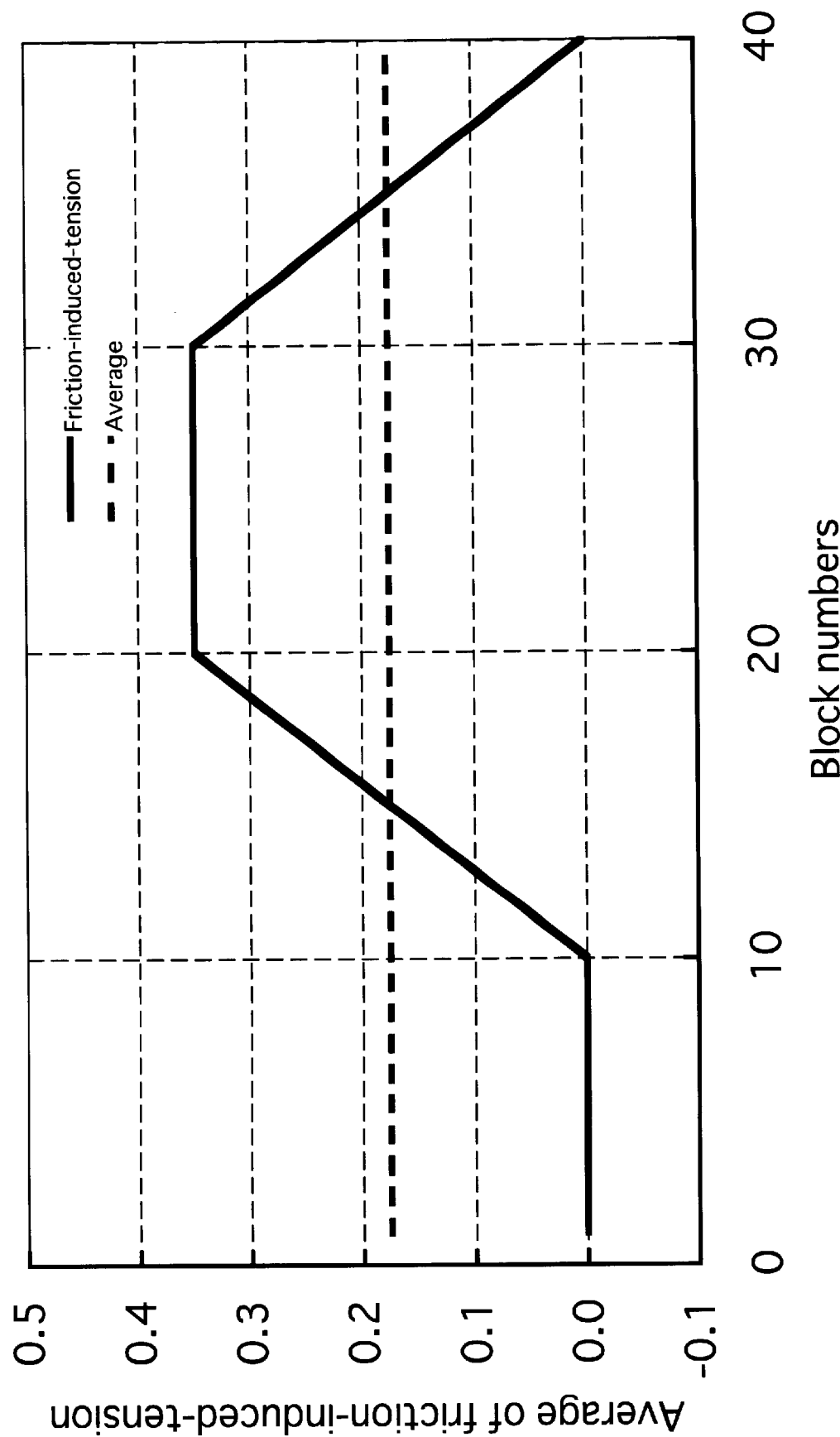
Figure 8F:
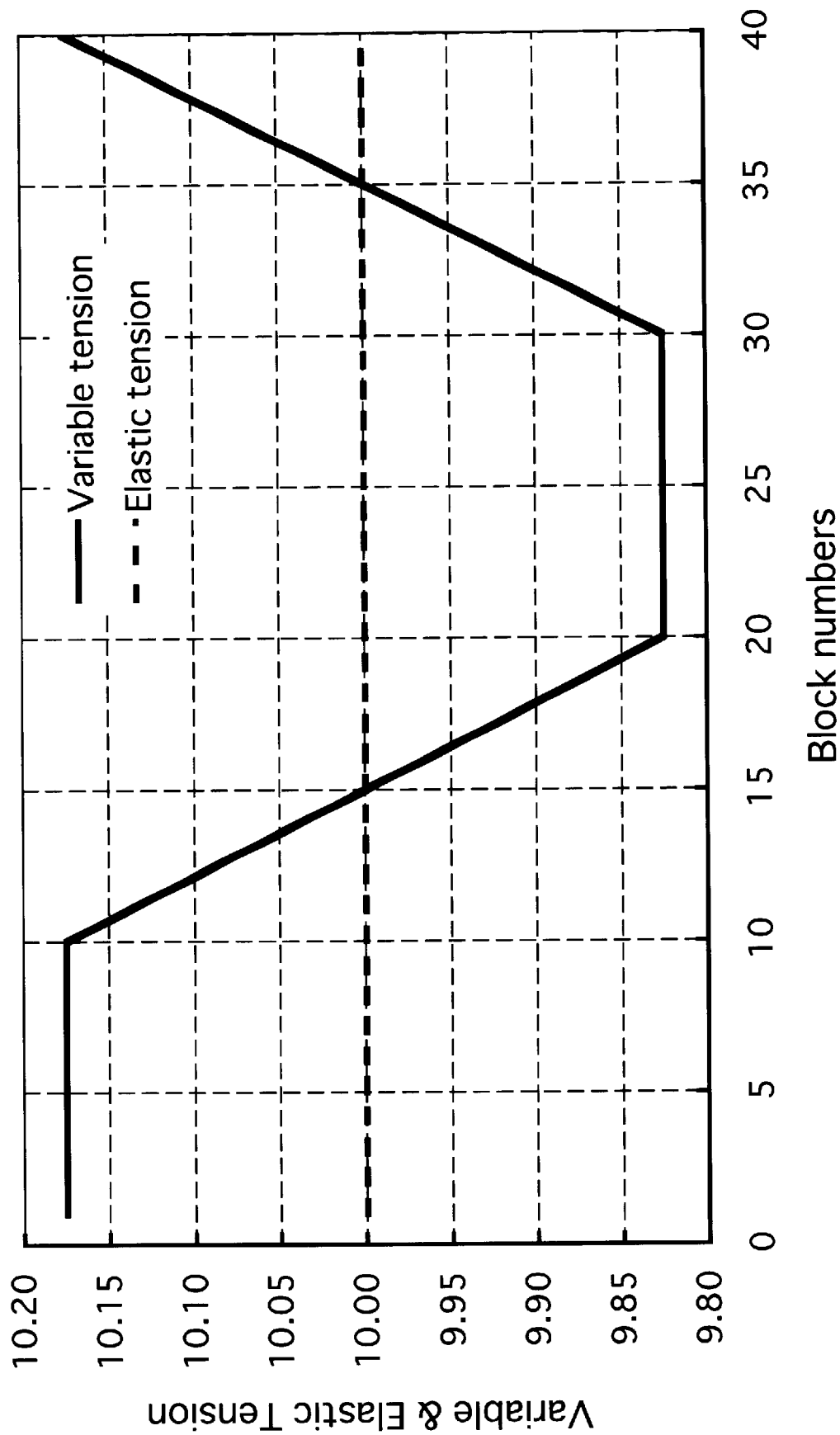

If we use the elastic tension as the initial trial value for the tension distribution, the normal-force- and friction-force-distributions will also be constant over the wrap-around sections as shown in FIGS. 8A and 8B. Then, assuming zero reference tension, the additional tension due to the friction forces (the last term in Eq. (11)) can be computed as shown in FIG. 8C. It should be noted that FIG. 8C represents the tension distribution purely by the friction forces. The average of the friction induced tension curve depends on the selection of the starting node, thus it represents the necessary amount of tension adjustment. The average friction induced tension, $T_{avg}$, more specifically $F_{avg}$, can be computed by dividing the area under the curve (see FIG. 8D) by the total number of nodes (blocks). FIG. 8E shows the computed average friction-induced tension. Then, the corrected tension distribution (see FIG. 8F) can be computed by:

$$T_i = T_e - \sum_{k=1}^{i} f_k + F_{avg} \tag{12}$$

Since we have started the tension calculation procedure using the constant elastic tension as the initial trial value for the tension distribution, we have to repeat the above procedure until the convergence is achieved. This tension calculation procedure is put forth in algorithmic form in the flow chart of FIG. 3.

We can model each ring as a virtual element in the form of the second order differential equation. Thus, the speed of a ring is available at any time t. It is assumed that the two set of rings 14 are composed of one steel band and that the ring tension is applied to the left and right saddle-surface centers of each block 12.

And, all parts except the two sets of rings 14 are modeled as rigid bodies. Kinematic constraints are used to represent the bearings and roller splines for the pulleys 16a, 16b. In the embodiment, the axial distance between the two driving (primary) pulley 16a halves is held constant. A constant clamping force for the driven (secondary) pulley 16b is applied to the movable driven pulley half. The driving-pulley shaft rotates at constant speed, and the driven-pulley shaft receives a constant torque load. It is alternatively possible to applied the force to the side of the driving (primary) pulley 16a.

The block-to-block contacts and the block-to-pulley contacts are modeled as discretized point-to-surface contacts. The discretized contact points are defined on the rocking-edge line, the head nose location, and each side surface of the block. Each discretized contact point generates both normal contact force and the friction force.

Figure 9:
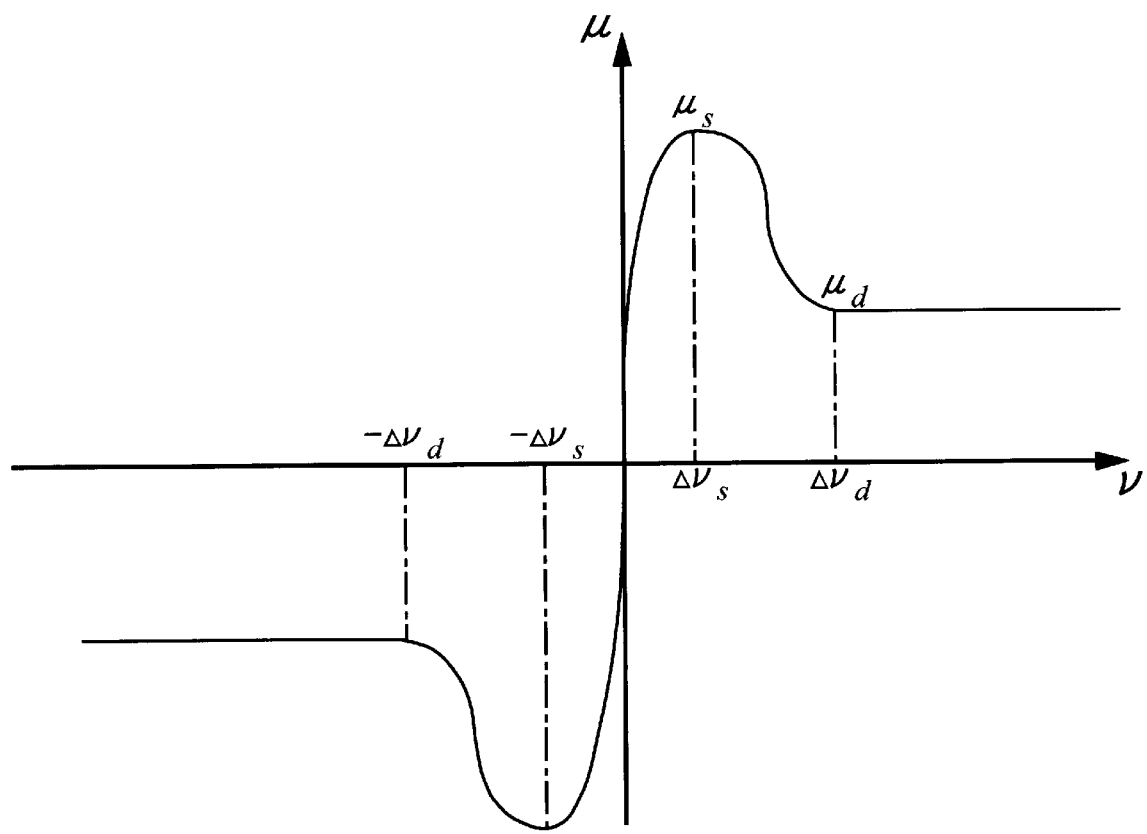
FIG. 9 is a graph representing a friction model to be used in the method illustrated in the flow chart of FIG. 3.

The friction coefficient, $\mu_i$, between the block i and a ring is modeled as a nonlinear function of the relative sliding speed, $\Delta v \equiv v_i - v_{ring}$, as shown in FIG. 9. The subscript "s" of the variables in FIG. 9 represents the static peak value, and the "d" represents the dynamic sliding value.

The virtual ring concept relies upon the instant locations and orientations of the blocks to compute the total ring length, block-to-ring friction distribution, and the ring tension distribution. The total ring length determines the pure elastic ring tension. The block-to-ring friction distribution gives rise to the variation of the ring tension distribution.

Based on the above, the method of computing belt tension distribution of a metal-pushing V-belt for CVTs according to the embodiment of the invention will be explained with reference to FIG. 3.

The program begins in S10 in which $\vec{u}_{li}$, $\vec{u}_{ti}$ and $\vec{u}_{di}$ for all blocks 12 (i=1~n) are computed.

where $\vec{u}_{li}$: a unit vector from the current block i to the leading block i+1

$\vec{u}_{ti}$: a unit vector from the current block i to i to the trailing block i−1

$\vec{u}_{di}$: a global position vector of block i

The program then proceeds to S12 in which $v_i$ and $\mu_i$ for all blocks 12 are computed.

where $\mu_i$: sliding speed of block i relative to ring $\mu_i$: friction coefficient between the block i and the ring as a nonlinear function of vi and the ring speed, $v_{ring}$, from the ring differential equation.

The program then proceeds to S14 in which the elastic tension, $T_e$ is computed using the information from S10 by $$T_e = k_e(l - l_0) \tag{13}$$

where $k_e$: longitudinal spring coefficient of the ring l: current length of the ring $l_0$: free length of the ring.

The program then proceeds to S16 in which the initial trial value of $T_e$ is given to the tension distribution, $T_i$, as:

$$T_i = T_e \tag{14}$$

The program then proceeds to S18 in which the saddle normal force distribution, $N_i$ is computed by $$N_i = T_{i-1} \vec{u}_{ti} + T_i \vec{u}_{li} \tag{15}$$

The program then proceeds to S20 in which the friction force distribution, $f_i$ is computed by $$f_i = \mu_i |N_i| \tag{16}$$

The program then proceeds to S22 in which the friction-induced-tension distribution (herein after referred to as "FITD"), $F_i$ is computed by $$F_i = \sum_{k=1}^{i} f_k \tag{17}$$

The program then proceeds to S24 in which the average of FITD is computed by $$F_{avg} = \frac{F_{sum}}{n} \tag{18}$$

where $$F_{sum} \equiv \sum_{k=1}^{n} F_k : \text{total area of FITD curve}$$

n: total number of blocks.

The program then proceeds to S26 in which the tension distribution $T_i$ is computed by $$T_i = T_e - (F_i - F_{avg}) \tag{19}$$

The program then proceeds to S28 in which it is checked if $\Delta F_{sum}$, the change of $F_{sum}$ from that of the previous iteration, is less than a tolerance value. If so, the program proceeds to the next step. Otherwise, it goes back to S18.

The program then proceeds to S30 in which the tension distribution, $T_i$ is saved in the RAM of the microcomputer 30 for later use in block force/moment calculations.

The program then proceeds to S32 in which the net frictional force, $F_{net} = F_n$ is similarly saved, so that the value can be accessed by the differential equation for the ring dynamics.

With this, the ring tension distribution at the given time t can be determined.

Figure 10:
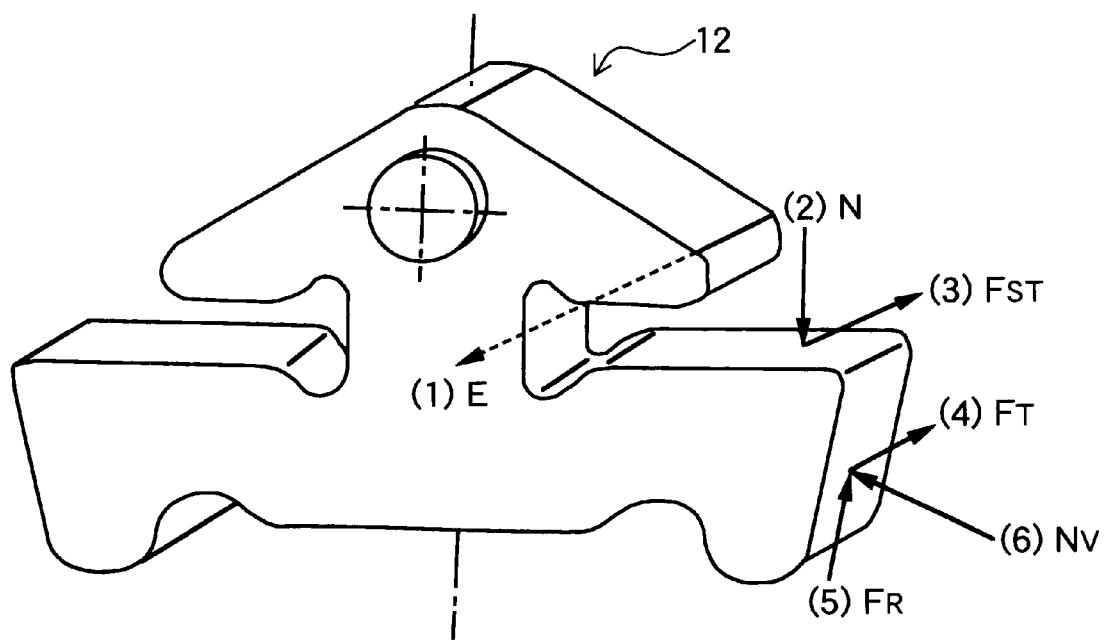
FIG. 10 is a schematic view showing the direction of loads that can be obtained by conducting the method illustrated in the flow chart of FIG. 3.

Using this method, it becomes possible to obtain solutions of various loads acting on the metal-pushing V-belt, with a decreased computation cost. Explaining this with reference to FIG. 10, it becomes possible to determine solutions of the loads as follows:

E: Compression force between adjacent two blocks (indicated by (1) in the figure);

N: Normal contact force between block and ring (indicated by (2) in the figure);

$F_{ST}$: Tangential friction force between block and ring (indicated by (3) in the figure);

$F_T$: Transmitting force (indicated by (4) in the figure);

$F_R$: Radial friction force (indicated by (5) in the figure);

$N_V$: Normal contact force between block and pulley (indicated by (6) in the figure);

T: Ring tension (see FIG. 4).

SIMPLE EXAMPLE 1

Figure 11:
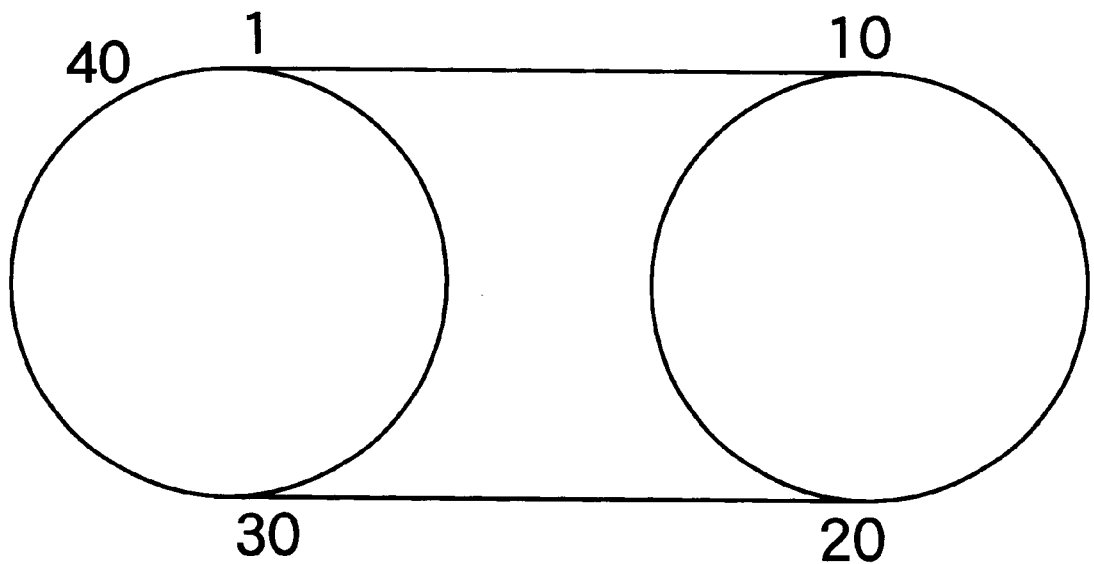
FIG. 11 is a schematic view showing an example of a simplified system of the V-belt to which the algorithm of the method is applied.
Figure 12A:
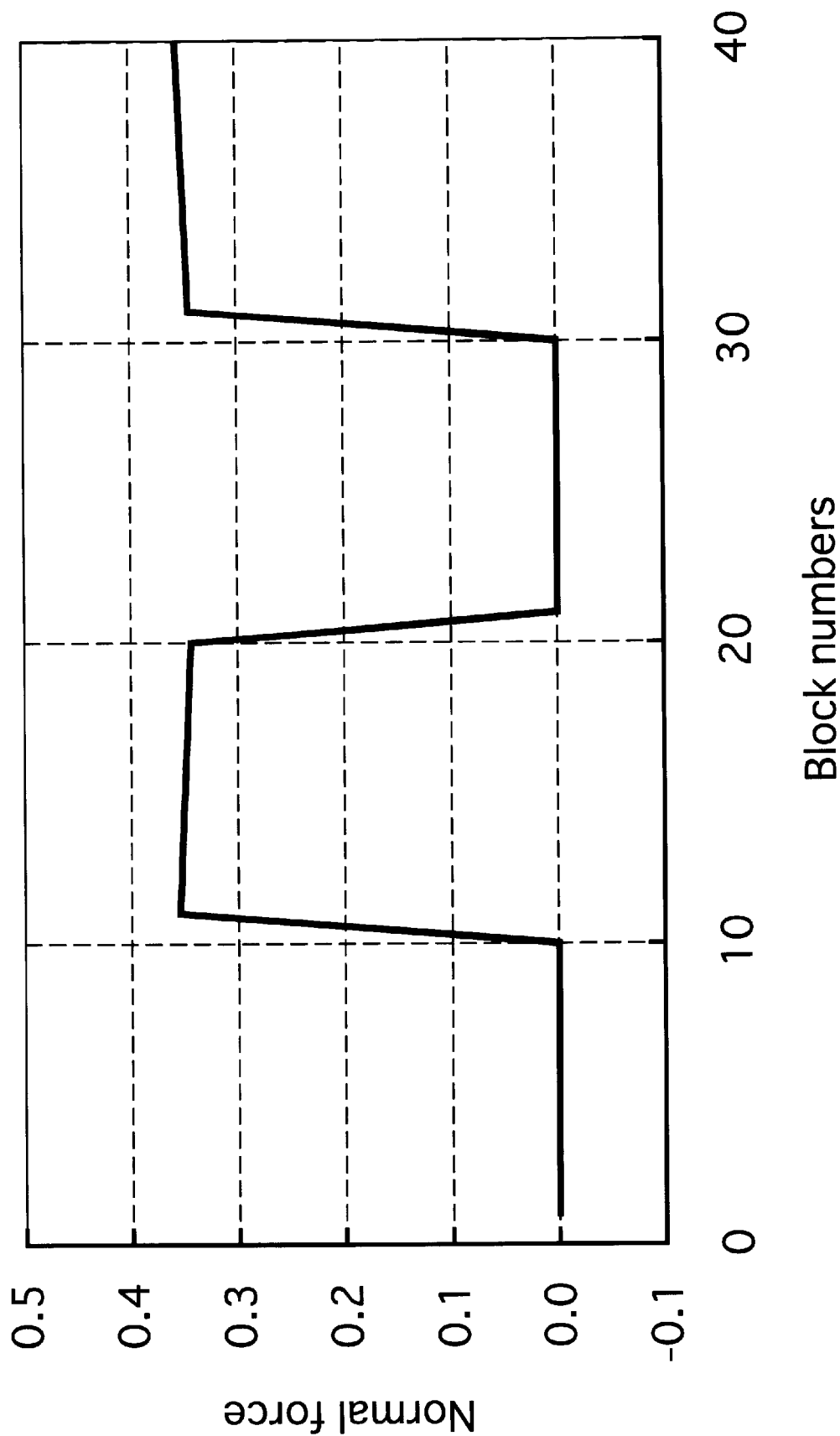
Figure 12B:
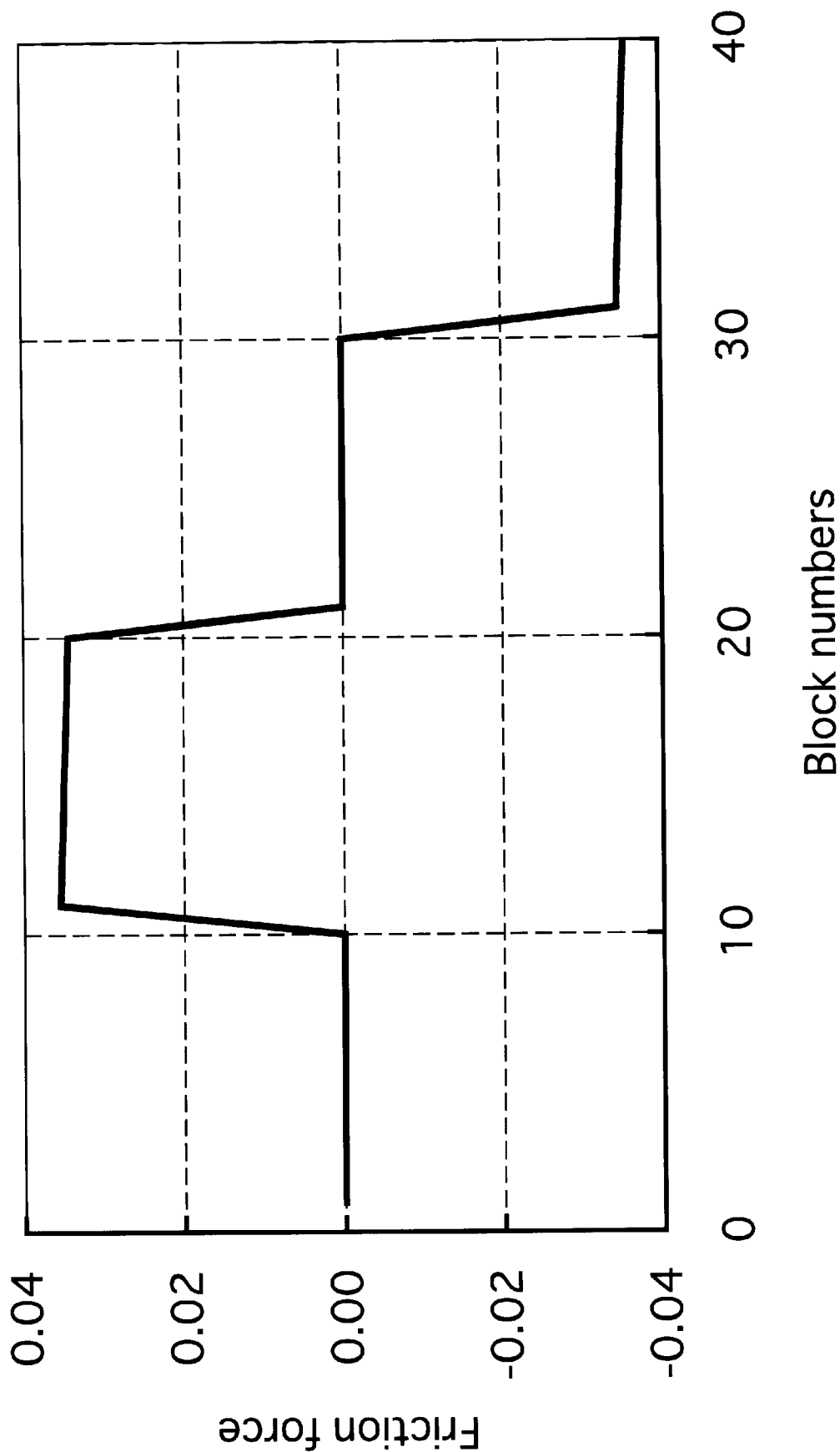
Figure 12C:
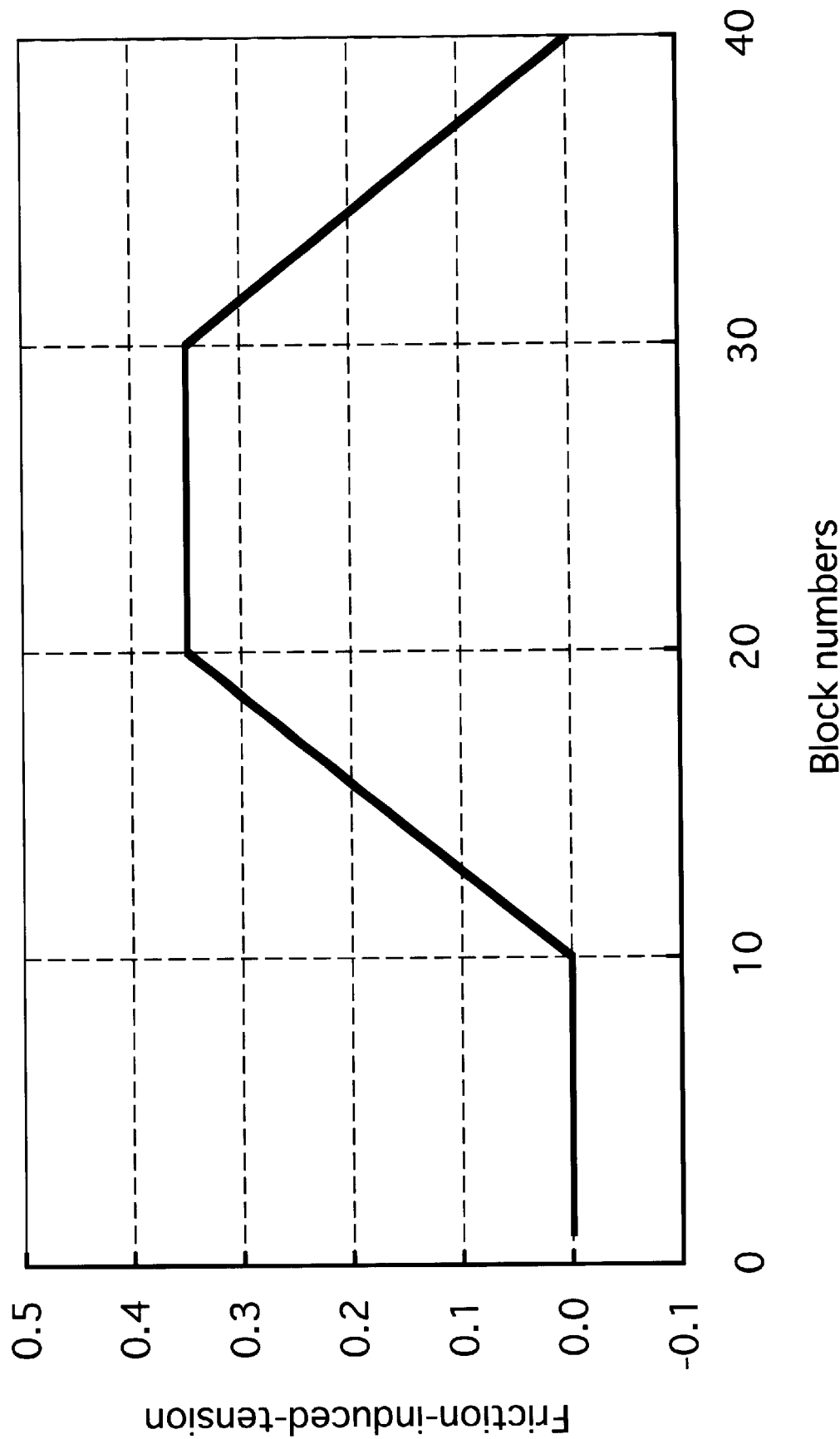
Figure 12D:
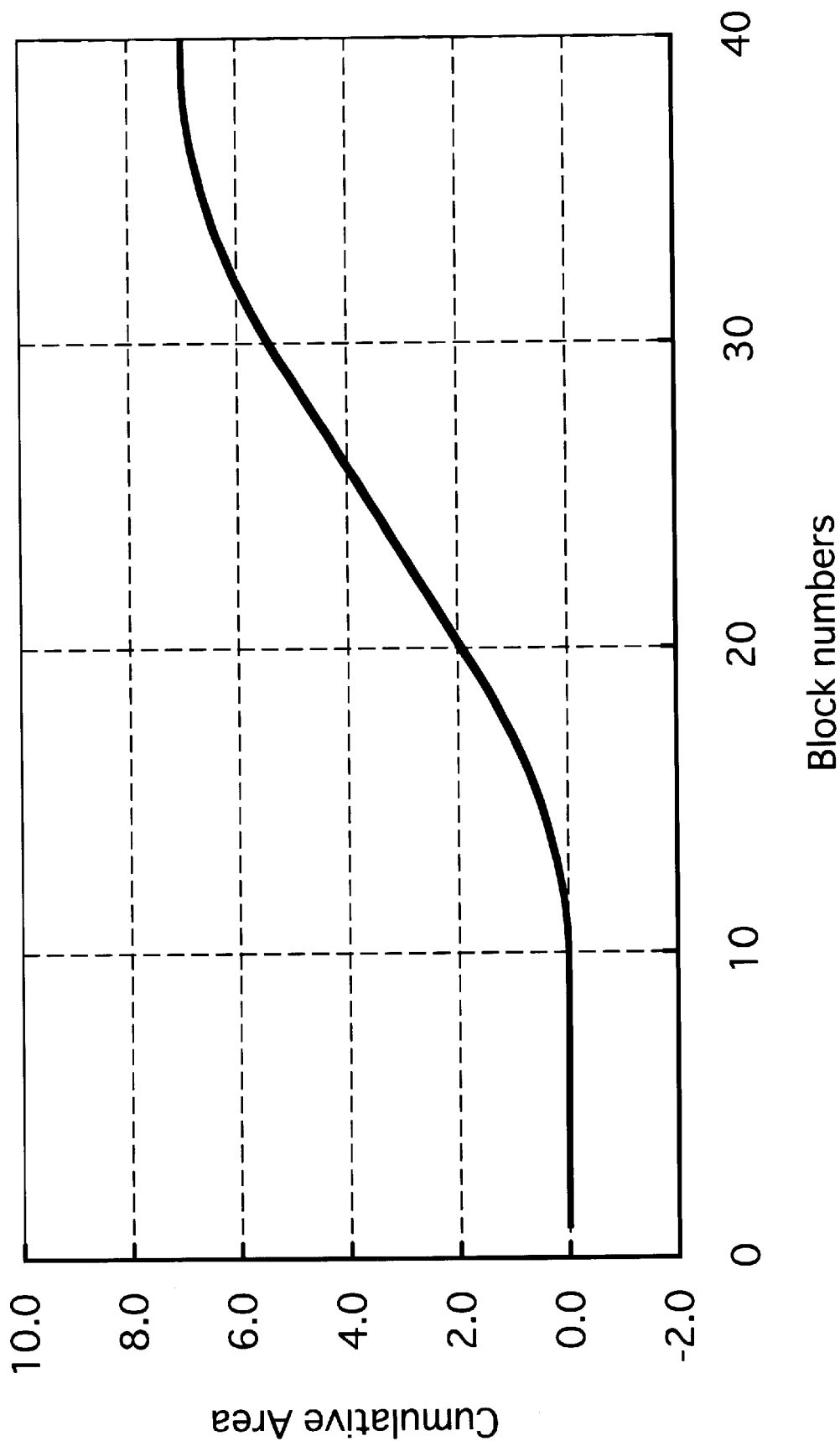
Figure 12E:
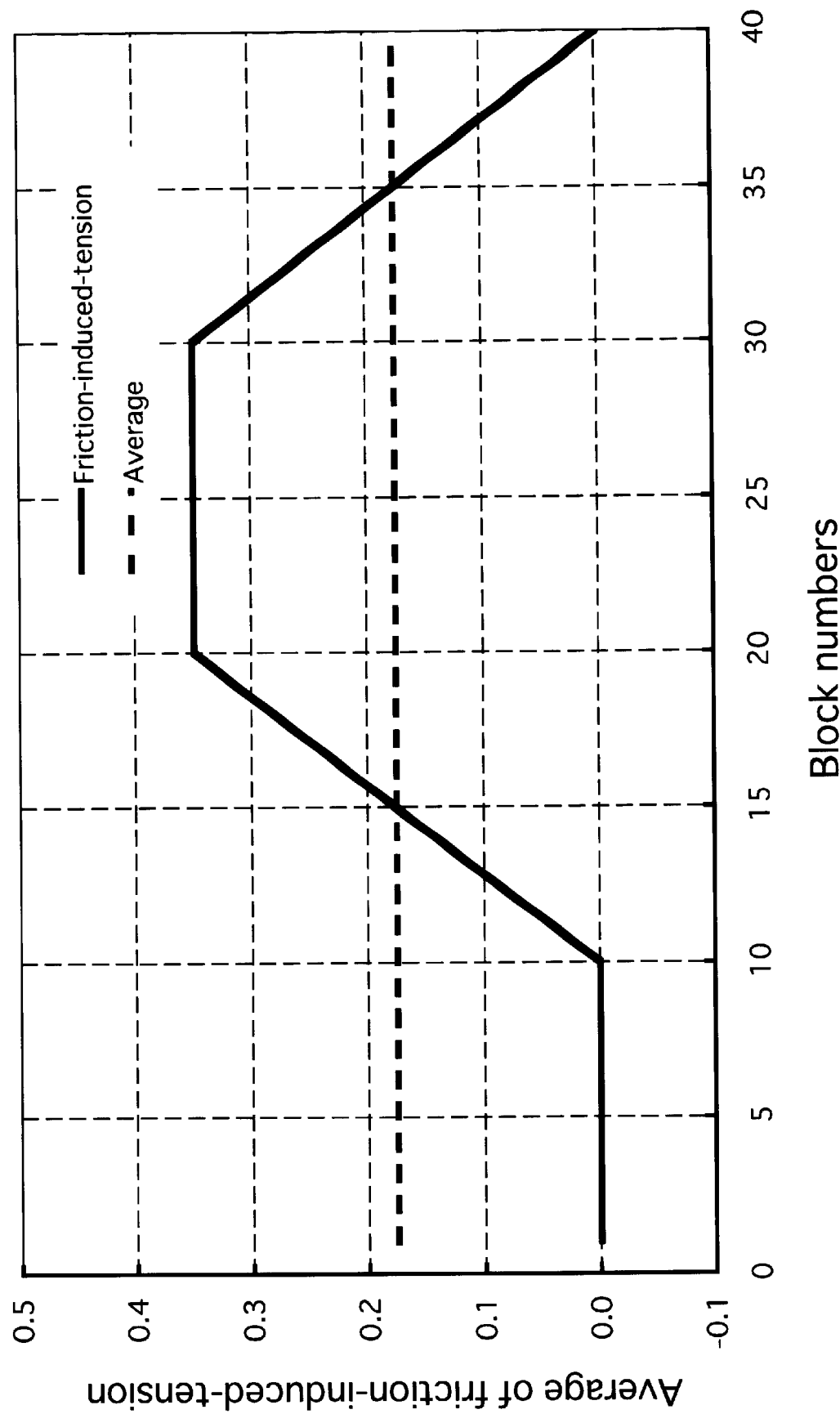

Let us apply the virtual ring tension algorithm to a simplified system shown in FIG. 11. The system has two pulleys, 40 blocks and one ring. It is assumed that the blocks on the left pulley have negative sliding speed relative to the ring, while those on the right pulley have positive relative sliding speed. FIG. 11 also shows the locations of the blocks at the current time t. The blocks 1 through 10 are positioned at the upper straight section of the ring; the blocks 11 through 20 are at the right wrap-around section; the blocks 21 through 30 are at the lower straight section; and finally the blocks 31 through 40 are at the left wrap-around section.

FIGS. 8A through 8F show the computed results after the first iteration of the algorithm. FIG. 12A through 12F are the results after the convergence has been achieved. When compared to FIGS. 8A to 8F, FIGS. 12A to 12F show the variations of the normal force and friction force at the left or right wrap-around sections.

SIMPLE EXAMPLE 2

Figure 13:
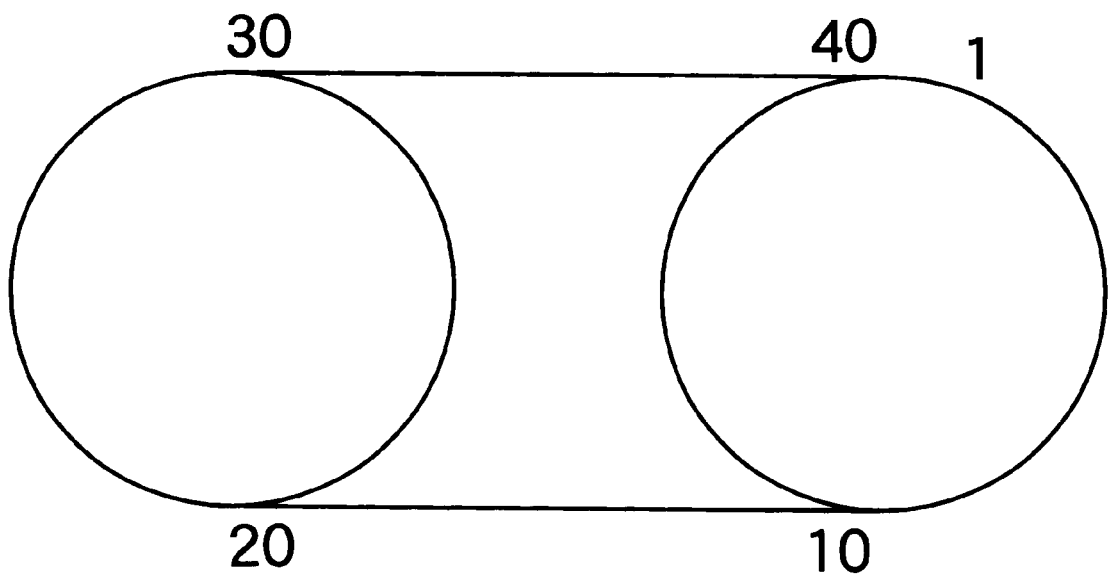
FIG. 13 is a schematic view showing another example of a simplified system of the V-belt to which the algorithm of the method according to the embodiment is applied.
Figure 14A:
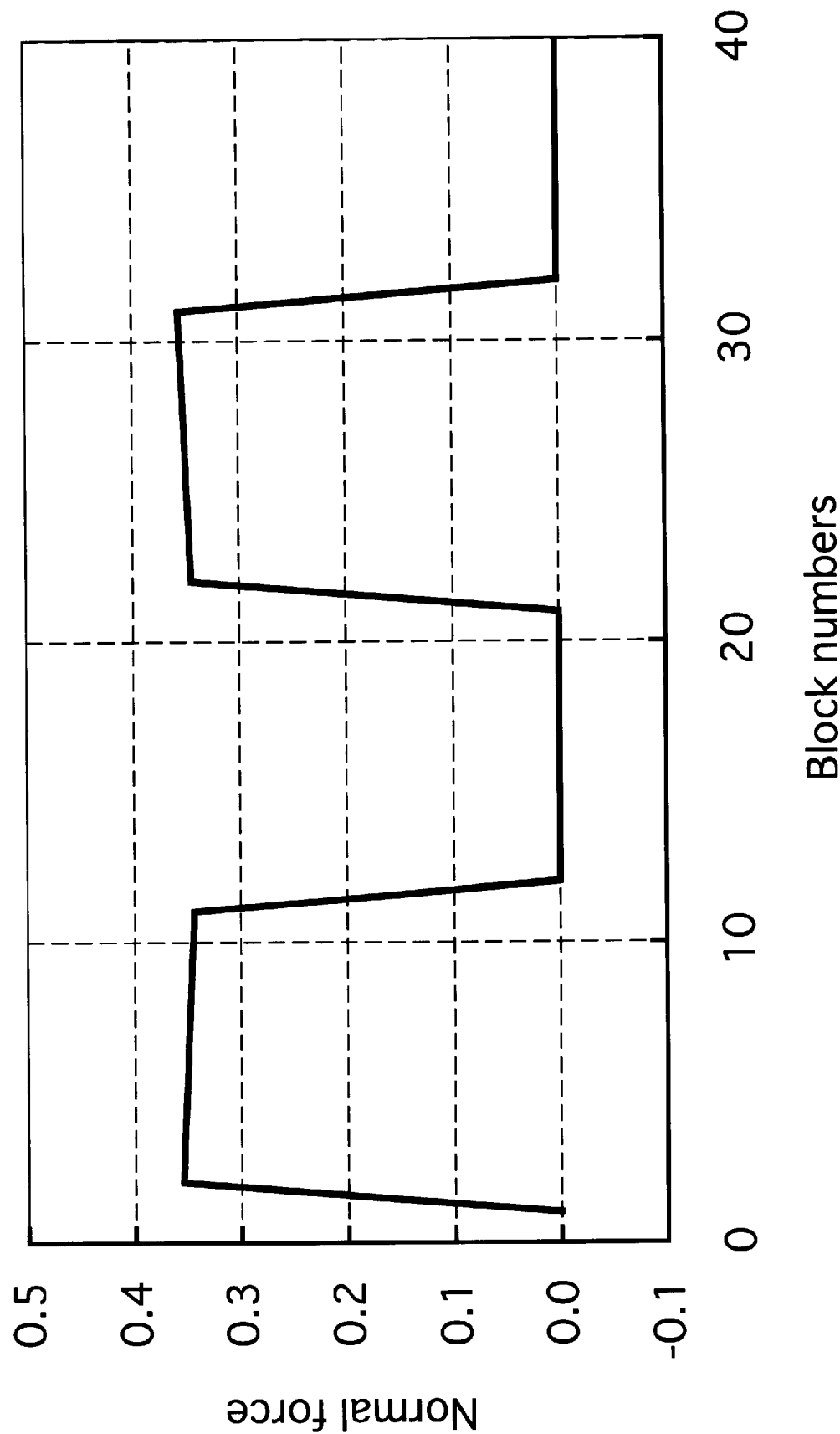
Figure 14B:
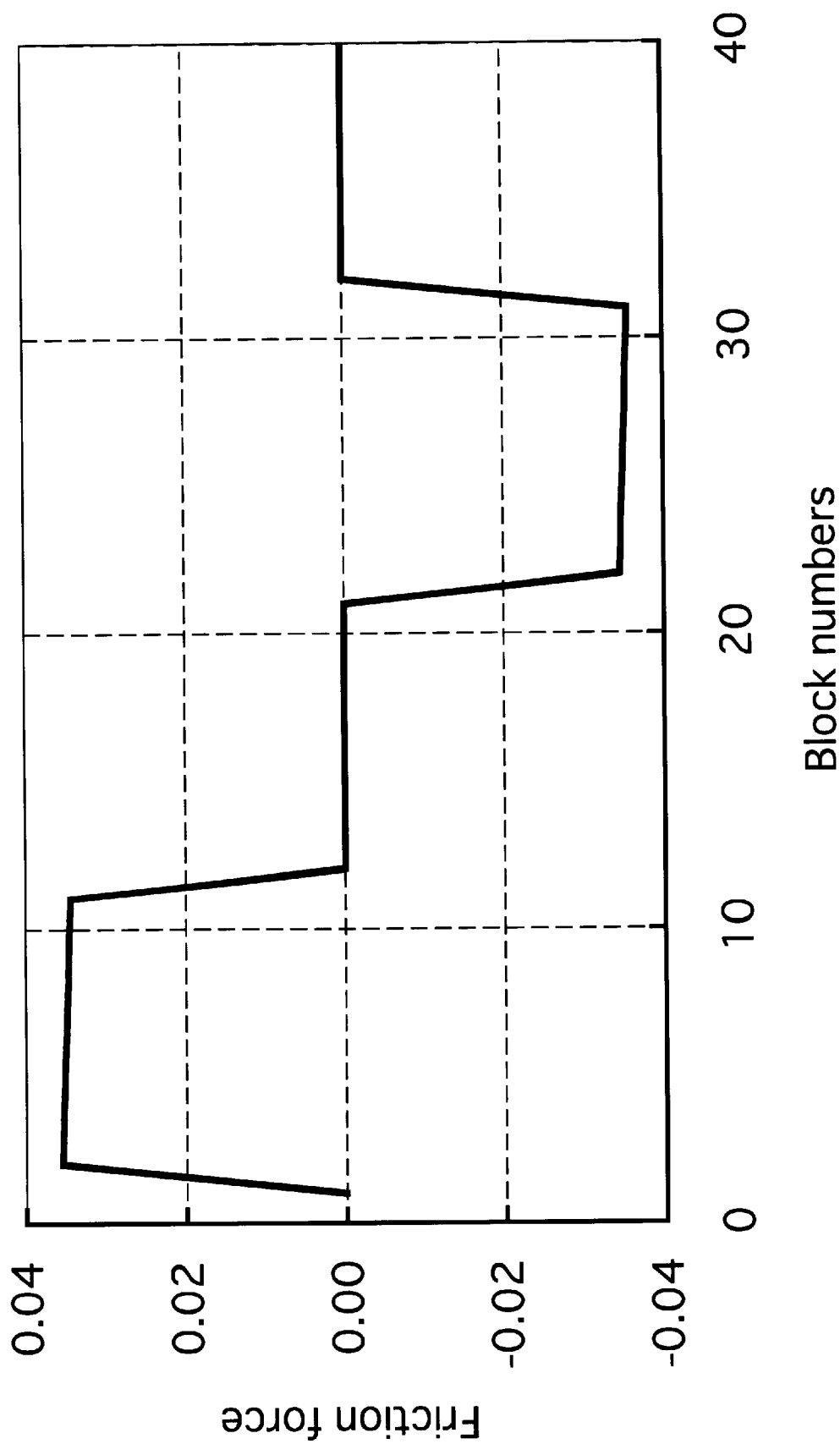
Figure 14C:
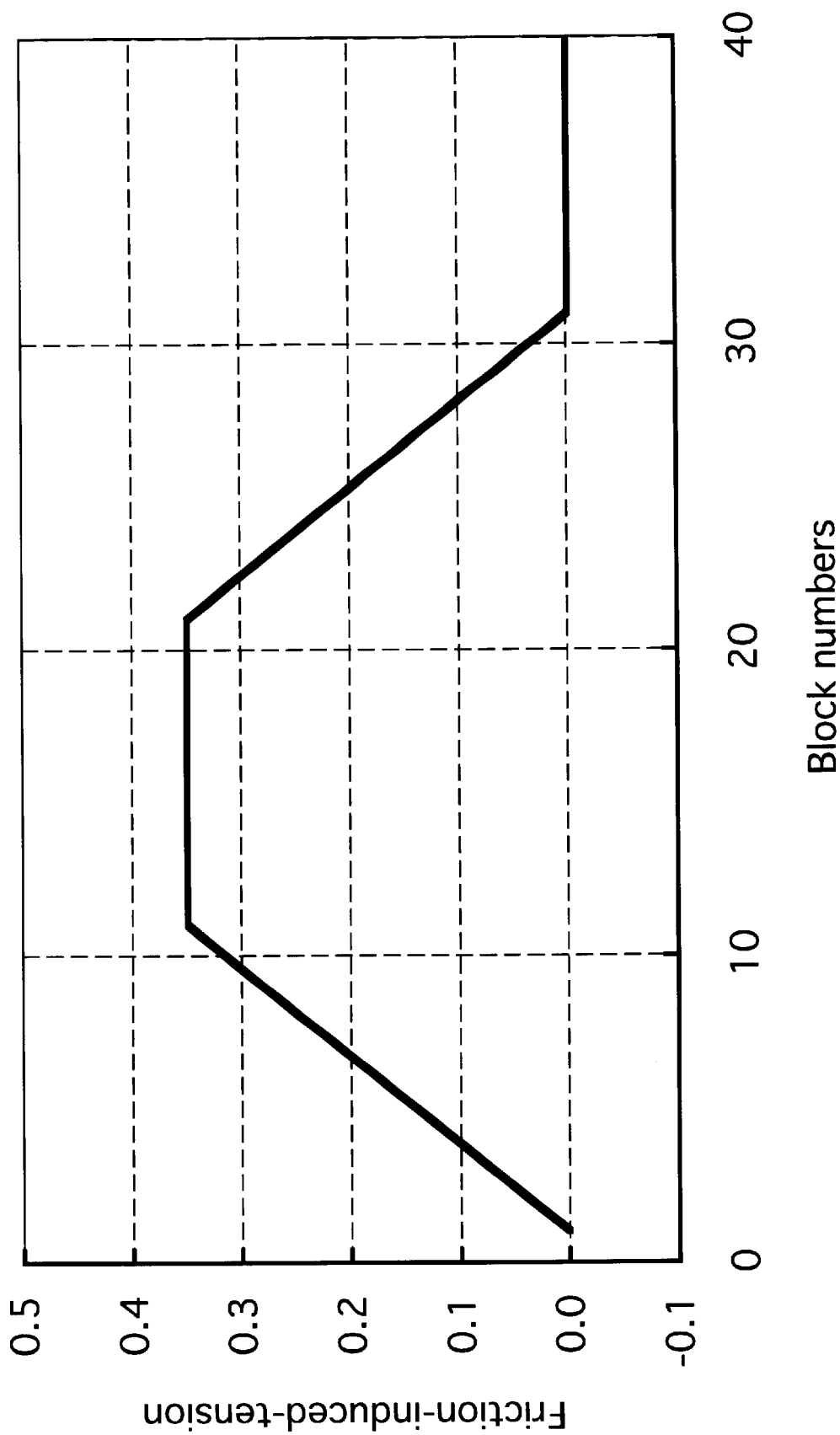
Figure 14D:
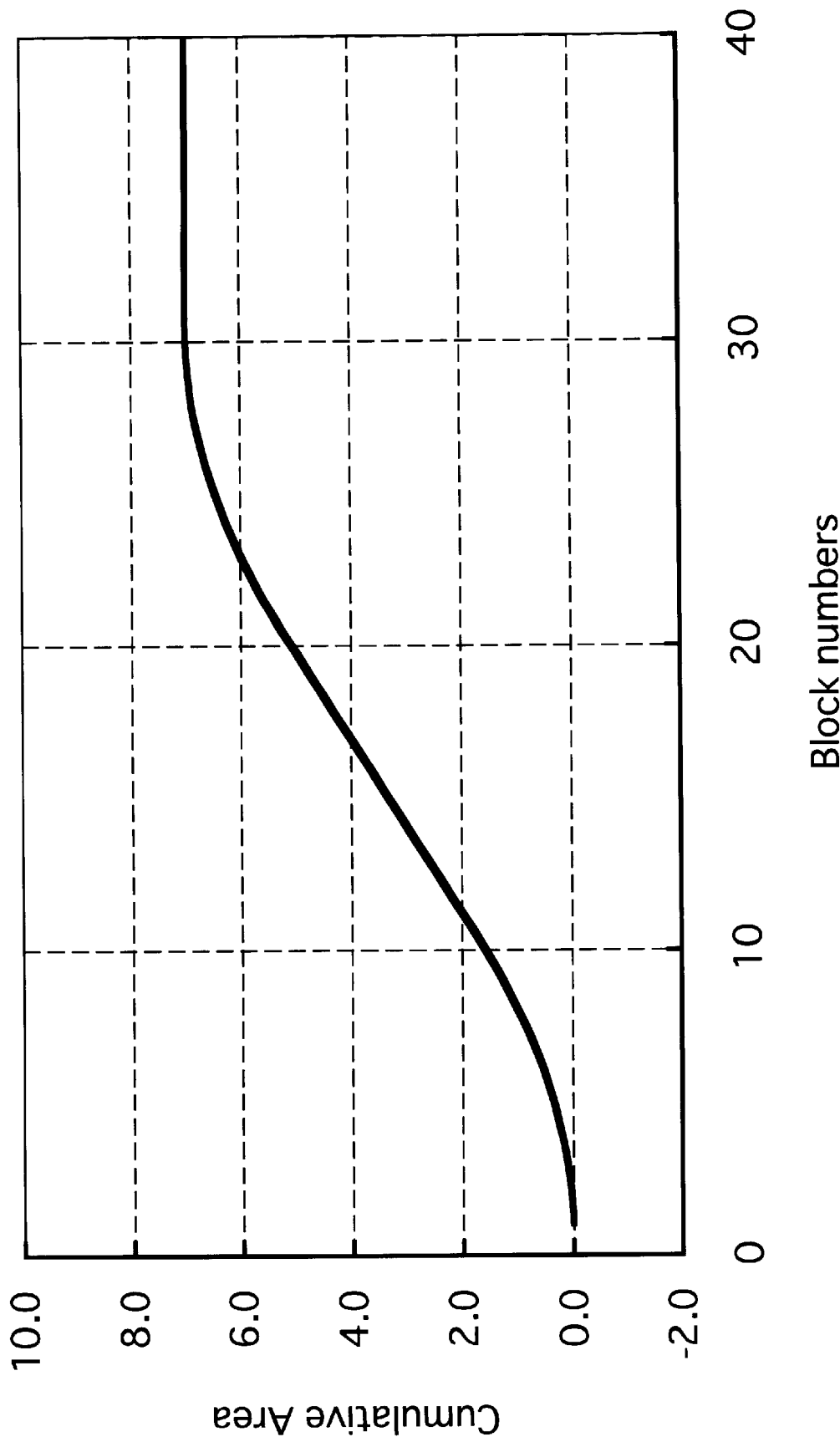
Figure 14E:
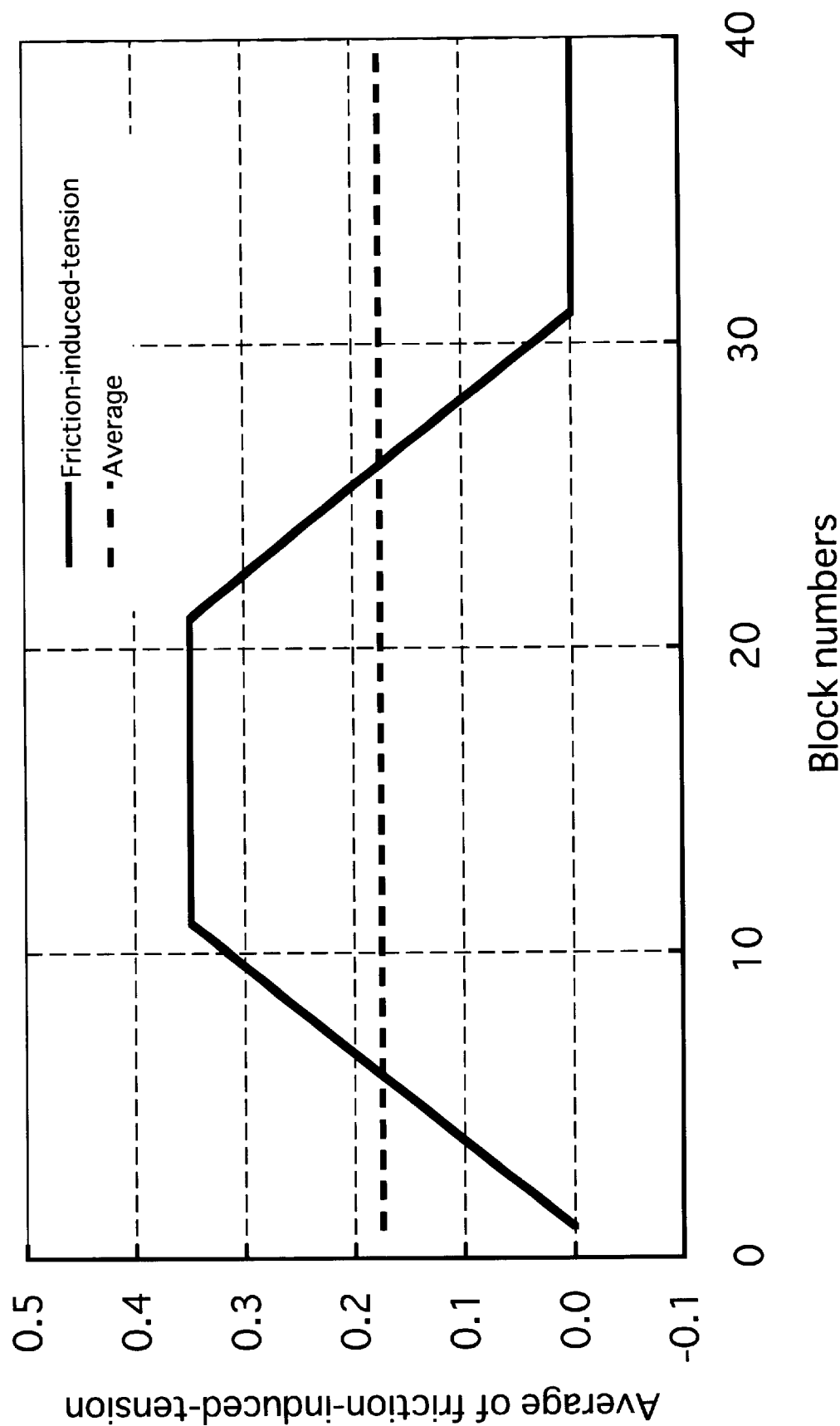

In order to demonstrate the starting-block-independent result of the algorithm, the starting block of this example is located at the position where the block 11 was in the previous example. This new location of blocks can be considered as the same system in the example 1 after the time elapse of $\Delta t$ so that the block 1 has now moved forward to a new location, as shown in FIG. 13.

FIGS. 14A through 14F show the completed results. The comparison of FIG. 14F with FIG. 12f shows that the two tension distributions are virtually identical except that they have relative horizontal shift. This demonstrates that the algorithm is not sensitive to the selection of the starting block.

Figure 15:
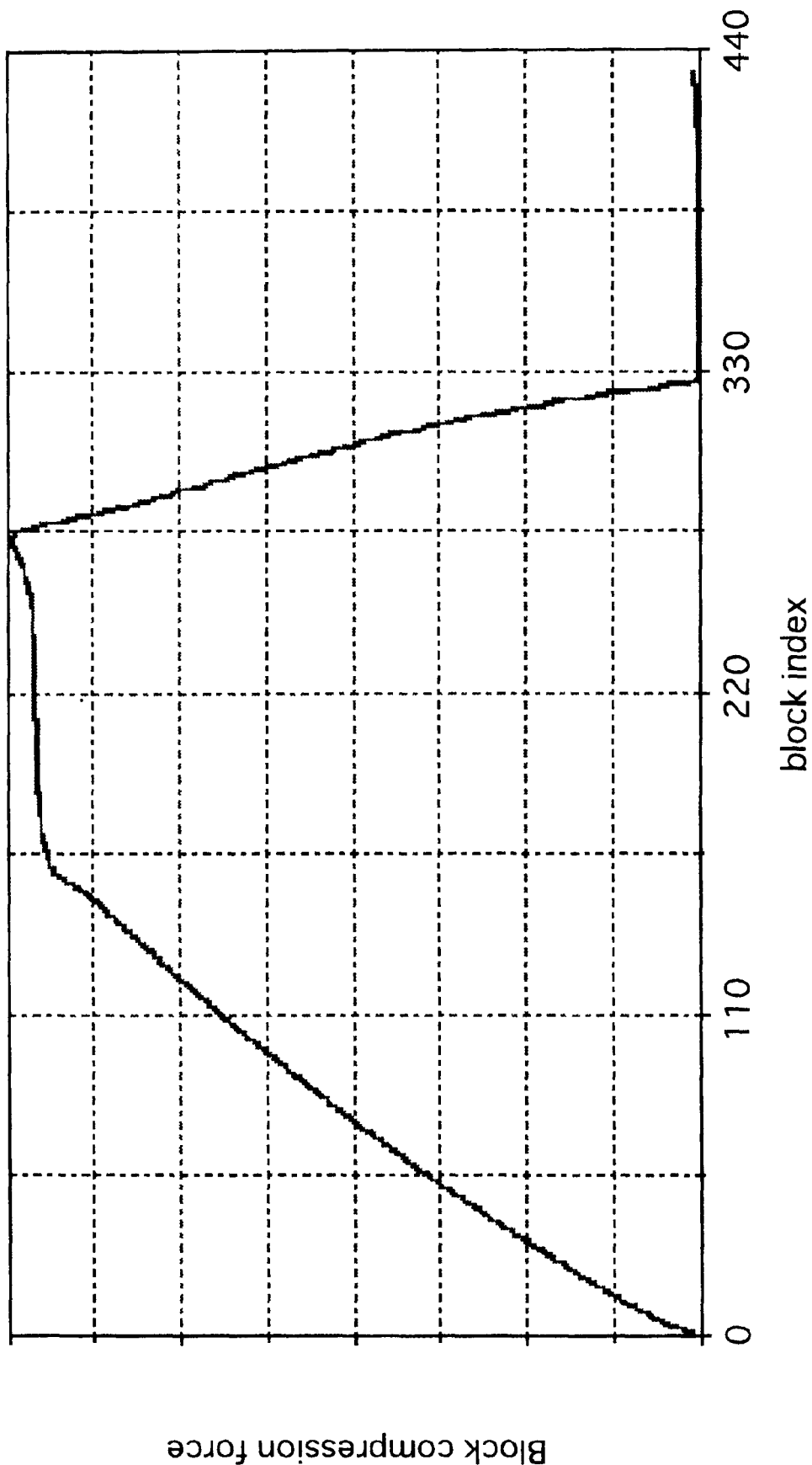
FIG. 15 is a graph showing a block compression force profile obtained by a sample simulation demonstrating the accuracy of the method illustrated in the flow chart of FIG. 3.

Moreover, sample simulation was performed for a CVT system with a speed ratio, an input shaft speed, and a torque load. FIG. 15 shows the block compression force profile (distribution along the belt) at the end of the simulation time. FIG. 16 shows the ring tension profile. The profiles show reasonable agreement with those presented in the aforesaid SAE paper written by S. Kuwabara et al.

As mentioned above, the method of computing belt tension using a computer model for the V-belts for CVTs is presented based on the virtual-ring concept. The virtual-ring concept significantly reduces the total degrees of freedom of the model, since the ring is modeled as a virtual element that exists only as the second order differential equation. The virtual ring concept relies upon the instant locations and orientations of the blocks to compute total length, local bending, block-to-ring friction distribution, and friction-induced tension distribution of the ring. A sample computer simulation was performed for a CVT system with given run conditions. It has been shown that a sophisticated, three-dimensional multibody model of the virtual ring concept is an effective tool for the multibody modeling of metal-pushing type CVT systems. Simulation yields good results both in ring tension distribution and block compression distribution along the belt.

In the above, it should be noted that, although the invention has been described with reference to the metal-pushing V-belt for CVTs, the invention will be applied to compute a tension of any other annular configuration if it yields tension when subject to a frictional force.

While the invention has thus been shown and described with reference to specific embodiments, it should be noted that the invention is in no way limited to the details of the described arrangements but changes and modifications may be made without departing from the scope of the appended claims.

What is claimed is:

1. A method of computing belt tension distribution of a metal-pushing V-belt for CVTs having an array of V-shaped blocks and plural sets of rings each running through slots formed at the blocks and wound around pulleys comprising the steps of:

(a) modeling the blocks as rigid bodies with contact points to represent surface to surface contact between adjacent blocks and between the blocks and the pulleys, while modeling the rings as a closed-loop string which is subject to an elastic tension caused by the pulleys;

(b) dividing the closed-loop string into string segments, and computing the elastic tension and computing a friction force caused by at least one of the blocks for each of the string segments using the computed elastic tension as an initial value;

(c) computing a friction-induced-tension based on the computed friction force for each of the string segments;

(d) repeating the steps (b) and (c) until a difference of the friction-induced-tension converges to a tolerance value; and (e) computing a ring tension based on an average of the computed friction-induced tensions of the string, when the difference converges to the tolerance value.

2. A method according to claim 1, wherein the step (b) further includes:

(f) computing a sliding speed of at least one of the blocks relative to at least one of the string segments;

(g) computing a friction coefficient between at least one of the blocks and at least one of the string segments based on at least the computed sliding speed;

(h) computing a normal contact force between at least one of the blocks and at least one of the sting segments based on at least the initial value; and (i) computing the friction force based on the compound normal contact force and the friction coefficient.

3. A method according to claim 2, wherein the step (g) computes the friction coefficient using a nonlinear function of at least one of the sliding speeds relative to a speed of the string segment.

4. A method according to claim 2, wherein the step (h) further includes;

(j) computing a first unit vector from at least one of the blocks to a leading block; and (k) computing a second unit vector from at least one of the blocks to a trailing block; and (l) computing the normal contact force based on the initial value and the computed unit vectors.

5. A system according to claim 1, wherein the step (b) computes the elastic tension based at least on a longitudinal spring coefficient of the rings and a length of the rings.

\* \* \* \* \*